United States Patent

McRae et al.

[11] 4,365,338
[45] Dec. 21, 1982

[54] TECHNIQUE FOR HIGH RATE DIGITAL TRANSMISSION OVER A DYNAMIC DISPERSIVE CHANNEL

[75] Inventors: Daniel D. McRae, West Melbourne; George C. Clark, Indialantic; Nicholas C. Szuchy, Melbourne Beach, all of Fla.

[73] Assignee: Harris Corporation, Melbourne, Fla.

[21] Appl. No.: 163,516

[22] Filed: Jun. 27, 1980

[51] Int. Cl.³ .............................................. H03H 17/00
[52] U.S. Cl. ........................................ 375/12; 375/34
[58] Field of Search .............................. 375/12, 13, 34

[56] References Cited

U.S. PATENT DOCUMENTS

| | | | |
|---|---|---|---|
| 4,027,258 | 5/1977 | Perreault | 375/12 |
| 4,038,536 | 7/1977 | Feintuch | 235/152 |
| 4,058,713 | 11/1977 | Di Toro | 364/724 |

Primary Examiner—Glen R. Swann, III
Attorney, Agent, or Firm—Antonelli, Terry & Wands

[57] ABSTRACT

In a communication system for transmitting information over a dispersive link, a transmitted message is assembled to contain alternately arranged known and unknown pluralities of data symbols. At the transmitter, the known data symbols may be produced by a maximal length PN sequence generator, with an identical generator being provided at the receiver for reproducing the known symbol sequences to enable data recovery to be achieved. In the received signal processing equipment, the received message is subjected to a prescribed data recovery algorithm containing a transversal filter function and a data estimate refinement scheme which takes advantage of the a priori knowledge of data symbols of those portions of the transmitted message between which unknown data symbols are located. A transmitted message contains a plurality of successive frame, each frame containing N known data symbols followed by M unknown data symbols. Thus preceding and succeeding each set of M unknown data symbols there are respective sets of N known data symbols that enable the characteristics of the transversal filter function, and thereby the data estimates of the unknown symbols, to be updated and adaptively refined. Synchronization of the local PN sequence generator at the receiver with the PN sequence of which the successive sets of N known data symbols are composed in the transmitted message is achieved through a prescribed tone sequence/initialization scheme, subsequent to which unknown data is transmitted and processed at the receiver in accordance with the data recovery algorithm.

146 Claims, 10 Drawing Figures

TECHNIQUE FOR HIGH RATE DIGITAL TRANSMISSION OVER A DYNAMIC DISPERSIVE CHANNEL

FIELD OF THE INVENTION

The present invention relates to digital communications systems and, more particularly, to improvements in such communicating systems in which equalization is provided for the transmission function by an adaptive transversal filter technique for processing received signals that have been transmitted over a dynamic dispersive channel.

BACKGROUND OF THE INVENTION

There are a number of communication links, such as HF transmission paths, that introduce distortion or contamination into messages transmitted over the link and thereby make it difficult to faithfully reproduce the original message at the receiver. Transmission distortion may be the result of any number of effects, such as multi-path reception, group delay distortion, noise amplitude distortion, interference, dispersive fading or, in general, a time-spread of the time response of the overall communication link. Because of these adverse influences, the data received from the transmission medium is seldom the same as the original message, so that some form of anti-distortion compensation scheme must be employed in the receiver's signal processing equipment.

One approach is the use of adaptive equalizers or recursive filters through which the characteristics of the channel are estimated and the data is subjected to a predistortion filter function based upon the observed influence of the channel on the signals as they are received. For an overview of various proposals dealing with recursive filter/equalization implementations attention may be directed to the description of the various techniques described in U.S. Pat. No 4,038,536 to Feintuch. While these systems seek to adapt themselves to the distortion introduced into the data, they rely on unknown signal inputs and suffer from a degree of estimation or inaccuracy that limits the data rate to which they may be applied.

Another scheme, described in U.S. Pat. No. 4,058,713 to Di Toro, seeks to provide adaptive equalization to compensate time spread and frequency spread distortion, and for this purpose, employs a known signal that is interleaved with segments or portions of the original message at the transmitter, thereby creating alternating bursts of unknown data and known signal spaced apart in time and transmitted to the receiver. At the receiver, rather than employ a time domain equalization approach, the distortion compensation equipment converts the received message signal and a known test signal into the frequency domain for processing, in order to obtain an estimate of the transfer function of the communication link which can then be employed to recreate the originally transmitted message signal. Unfortunately, with this type of approach, there is a hiatus or delay factor involved in the format of the transmitted message, which not only limits the data rate, but may cause errors in the signal recovery process due to changes in the transmission channel.

SUMMARY OF THE INVENTION

In accordance with the present invention there is provided a signal transmission and data recovery technique that overcomes the signal distortion-introducing characteristics of a communication link, such as an HF channel, discussed above, through the combination of a prescribed transmission scenario and an adaptive filtering process capable of handling a data rate of 8 kbps or higher. As a result, the system can faithfully transmit digitally encoded voice using inexpensive devices, such as continuous variable slope delta modulator CVSDs, that are less sensitive to HF burst noise, but require a modem operating at a data rate considerably higher than the currently available 4.8 kbps HF modems that can support a 2.4 kbps data rate as required for linear predictive coding.

Pursuant to the novel scheme employed in accordance with the present invention, the transmitted message is assembled to contain alternately arranged known and unknown pluralities of data symbols. At the transmitter, the known data symbols may be produced by a sequence generator, with an identical generator being provided at the receiver for reproducing the known symbol sequences to enable data recovery to be achieved. In the received signal processing equipment, the received message is subjected to a prescribed data recovery algorithm containing a transversal filter function and a data estimate refinement scheme which takes advantage of the a priori knowledge of data symbols of those portions of the transmitted message between which unknown data symbols are located. A transmitted message may be considered to contain a plurality of successive frames, each frame containing N known data symbols followed by M unknown data symbols or vice versa. Thus, preceding and succeeding each set of M unknown data symbols there are respective sets of N known data symbols that enable the characteristics of the transversal filter function, and thereby the data estimates of the unknown symbols, to be updated and adaptively refined. Synchronization of the local pseudo noise (PN) sequence generator at the receiver with the PN sequence of which the successive sets of N known data symbols are composed in the transmitted message is achieved through a prescribed tone sequence/initialization scheme, subsequent to which unknown data is transmitted and processed at the receiver in accordance with the data recovery algorithm.

DETAILED DESCRIPTION

Figure 1:
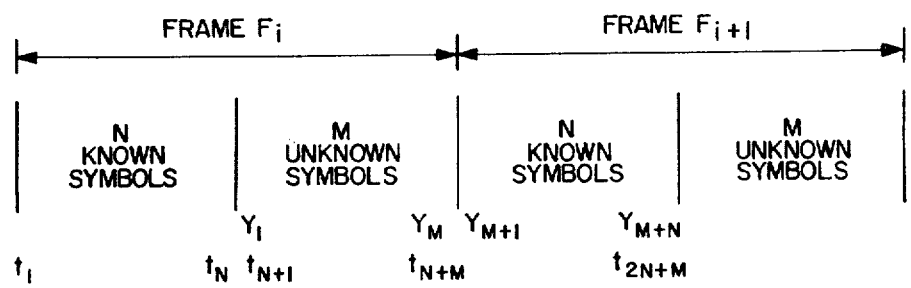
FIG. 1 is an illustration of the symbol contents of successive frames of data.

FIG. 1 illustrates the format of a message to be transmitted in accordance with the present invention. As was explained briefly above, a message is to be comprised of a series of frames, each frame containing N known symbols followed by M unknown symbols (or vice versa). For purposes of the present description, the data will be assumed to be encoded in binary format, with the N known symbols of a frame corresponding to data bits that form part of a pseudo noise sequence, whereas the M unknown data symbols of a frame constitute digital representations of the actual information signals of interest. These may be produced by a commercially available voice digitizer device, such as a CVSD. Thus, for any frame $F_i$, the transmitted message will be formatted to contain N known digital PN symbols $t_1$-$t_N$, followed by M unknown digitized voice symbols $t_{N+1}$...$t_{N+M}$. The manner in which a message is assembled and transmitted will be explained with reference to FIG. 2.

Figure 2:
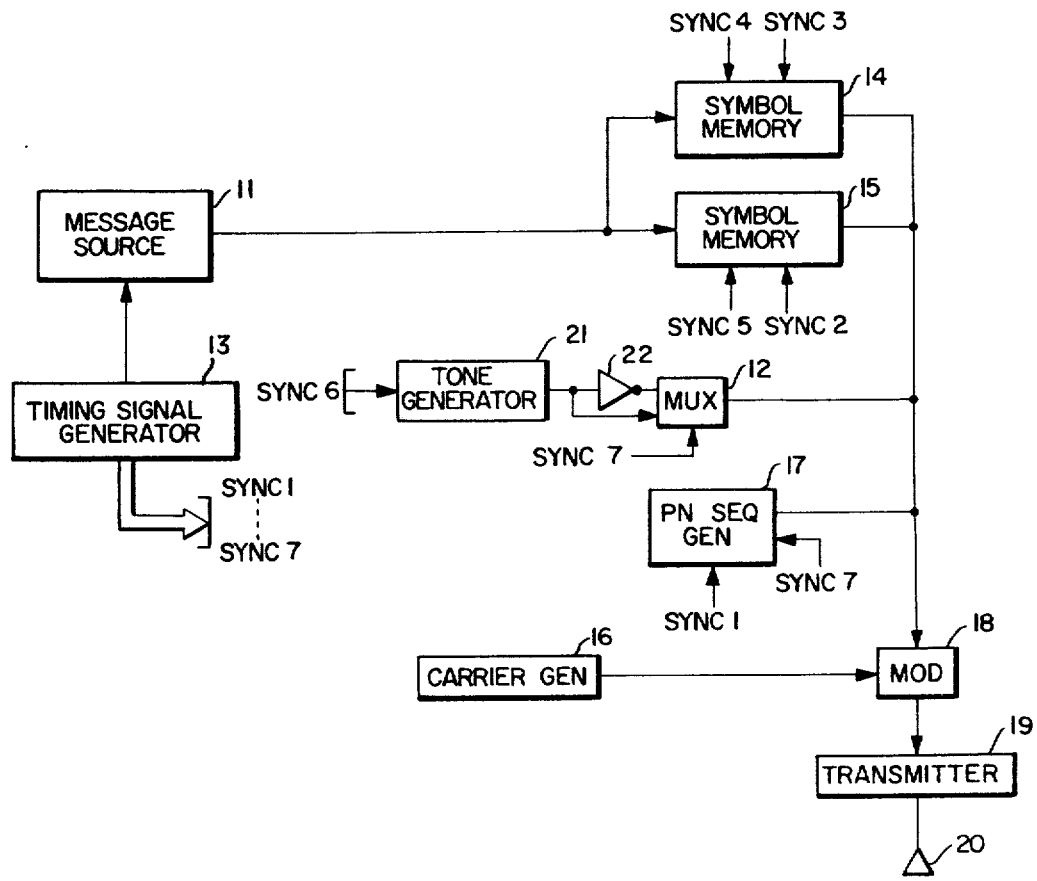
FIG. 2 is a block diagram illustration of a transmitter for assembling and transmitting the frames of data shown in FIG. 1.

FIG. 2 is a block diagram of the configuration of the transmitter portion of the communication system embodying the present invention, which generates the frame sequence shown in FIG. 1 and applies it to an RF transmitter for transmission over the HF channel. A message source 11, such as a CVSD, supplies output signals, representative of the unknown information signals to be conveyed over the HF channel to a pair of random access symbol memories 14 and 15. Timing signals for the operation of the components of FIG. 1 are derived from a timing signal or synchronizing signal generator 13. Signal lines for these signals are identified by SYNC number designations SYNC 1-SYNC 7. These timing signals are coupled to symbol memories 14 and 15, a tone generator 21, multiplexer 12 and PN sequence generator 17, as shown, to control the operations of these units, as will be explained in detail below.

The transmitter portion further includes a carrier generator 16 which supplies a locally generated carrier signal to a modulator 18, the output of which feeds an RF transmitter 19 for transmission of the assembled information signals over the HF channel via antenna 20. The carrier-modulating input to modulator 18 is derived from either RAM 14 or RAM 15 or from PN sequence generator 17 as will be explained subsequently.

As pointed out above, source 11 generates message information signals, and can comprise any message source (such as telephone signals) analog or digital, supplying information in the form of a varying electrical signal. In the case of an analog source, such as voice signals, a digitizing device such as a CVSD is incorporated as part of message source 11, so that its output is encoded in pulse format, preferably binary pulse format. In order to understand the manner in which the transmitter configuration shown in FIG. 2 produces the signal sequence shown in FIG. 1, attention is directed to FIG. 3 which shows a typical synchronization or timing signal sequence by which the transmitter of FIG. 2 operates.

Figure 3:
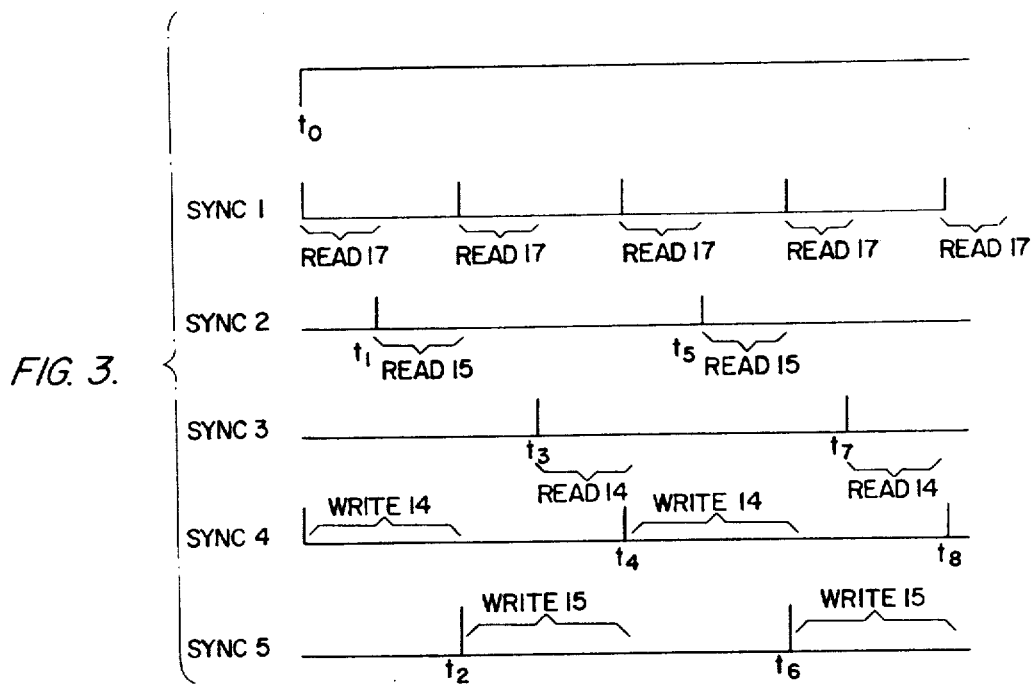
FIG. 3 is a timing diagram for explaining the operation of the transmitter configuration illustrated in FIG. 2.

The top line of FIG. 3 represents an uninterrupted digital message output of message source 11 beginning at time $t_0$. SYNC signal lines SYNC 1-SYNC 5 represent timing signal outputs applied to PN sequence generator 17 and RAMs 14 and 15 from generator 13 in order to generate the signal sequence shown in FIG. 1 to be applied to modulator 18. Signal SYNC 1 is applied to PN sequence generator 17 to cause it to generate a known signal sequence during a first read-out interval (identified as READ 17 corresponding to the reading out of signals from PN sequence generator 17). PN sequence generator 17 may comprise a ROM that has been programmed to produce a maximal length PN sequence, the maximal length being considerably longer than the number of symbols per frame. Simultaneously with the reading out of a portion of the PN sequence generator by PN sequence generator 17, the data output of message source 11 is written into one of memories 14 and 15 depending upon which of signals SYNC 4 and SYNC 5 is generated at the time. As shown in FIG. 3, at time $t_0$, SYNC 4 is generated simultaneously with SYNC 1, so that during time period $t_0$-$t_2$ the output of message source 11 is written into memory 14. Subsequently, at time $t_2$, the output of message source 11 is written into memory 15 as SYNC 5 is applied to the write enable input of memory 15 simultaneously with the generation of the next SYNC 1 signal. Through this alternate generation of timing signals SYNC 4 and SYNC 5, sequential portions of the output of message source 11 are alternately stored in memories 14 and 15.

To read out the contents of each memory and prepare them to receive and store new alternate sequential portions of the uninterrupted message, timing signal generator 13 produces read-out control signals SYNC 2 and SYNC 3. Upon the termination of the reading out of PN sequence generator 17 at time $t_1$, timing signal generator 13 applies read enable signal SYNC 2 to memory 15 in order to read out the contents of memory 15 during the period of time between times $t_1$ and $t_2$. Subsequently, at time $t_3$, read-out signal SYNC 3 is applied to memory 14 to read-out the contents of memory 14. Through the above-described alternate writing and reading out of memories 14 and 15, all of the data contained in the uninterrupted message output of message source 11 is applied in an interleaved fashion with the output of PN sequence generator 17 to modulator 18. It should be observed that during read-out, the data in memories 14 and 15 is read out at a rate faster than the rate at which it is written into memory so that it is compressed relative to the rate at which it is stored. Namely, the data writen into memory 14 at a first relatively slow rate during the interval $t_0$-$t_2$ is read out at a relatively fast rate (compared to the storage rate) during a shorter time interval $t_3$-$t_4$. Similarly, data written into memory 15 during time interval $t_2$-$t_4$ is read out as a faster rate during time interval $t_5$-$t_6$. As the technique of data compression, per se, is conventional, no further description will be presented here. Thus, at the modulation input of modulator 18, the outputs of memories 14 and 15 and PN sequence generator 17 are combined under the control of SYNC signals SYNC 1-SYNC 5 to obtain the message sequence shown in FIG. 1. This signal is modulated onto the output of carrier generator 16 and transmitted over the HF channel to the receiving station. An additional pair of synchronization or timing signals SYNC 6 and SYNC 7 are produced by timing signal generator to control the format of the beginning of a message transmission. These timing signals are applied to a tone generator 21, the output of which is coupled directly, and inverted via inverter 22, to respective inputs of a multiplexer 12. The output of multiplexer 12 is coupled to modulator 18. Also, the SYNC 7 timing signal output of generator 13 is coupled to operate PN sequence generator 17 during a portion of the beginning of a transmission as will be explained subsequently.

Figure 4:
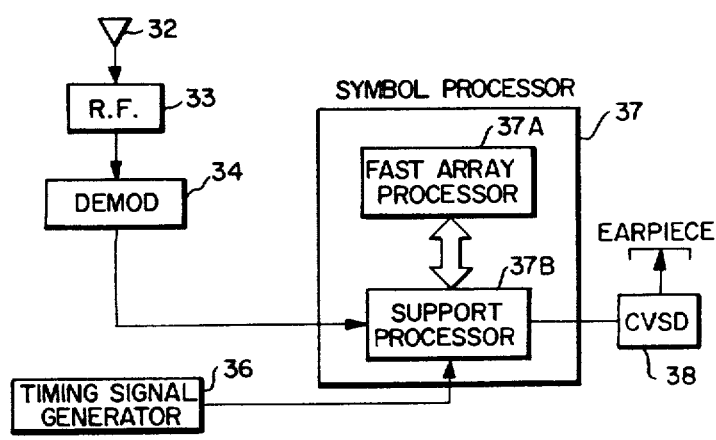
FIG. 4 is a block diagram illustration of receiver equipment for processing and recovering the successive frames of transmitted data shown in FIG. 1.

A block diagram of the receiver is shown in FIG. 4 as including a radio frequency section 33 to which a received signal is coupled via antenna 32. The incoming carrier is stripped off in the RF section 33 and the resulting IF signal is applied to demodulator 34, the output of which is coupled to an adaptive recursive filter-simulating symbol processor 37. The output of demodulator 34 corresponds to the data originally applied to modulator 18 at the transmitter but subjected to the influence of the HF transmission channel, so that the signal values applied to processor 37 may not, and most likely will not, correspond to those transmitted by the transmitter. Also employed as part of the receiver is a timing signal or sync generator 36, the output of which is coupled to processor 37. Timing signal generator contains a stable clock source under the control of which the various operations to be carried out by processor 37, to be discussed below, are carried out. As will be explained in particular detail below, processor 37 operates on the data produced by demodulator 34 in accordance with a data recovery algorithm that effectively simulates an adaptive transversal filter, the functional parameters of which are updated dynamically using the a priori knowledge of the known sets of symbols for adjacent signal frames, to predict the effeact of the HF channel on the unknown data symbols. The output of processor 37 represents the recovered data absent the distortion caused by the dispersive HF channel. This output is coupled to an output message device, such as a CVSD 38, for example, to produce an analog signal corresponding to the original message (e.g. voice) input at the transmitter.

Symbol processor 37 preferably consists principally of a pair of processor subsystems, illustrated in FIG. 4 as a fast array processor (FAP) 37A and a support processor (SUPP) 37B, to be discussed more fully below, which operate on the demodulated received signal symbols in accordance with a prescribed algorithm scenario and thereby proceed in recover the original data. Within the support processor subsystem 37B configuration there is also provided a local PN sequence generator, identical to that employed in the transmitter, which provides the successive groups of N known data symbols during the implementation of the data recovery algorithm through which successive frames of signals (consisting of N known and M unknown symbols each) are processed.

In order to facilitate a full appreciation and understanding of the present invention, the separate functions implemented by way of processor 37 will be individually explained, followed by a description of the overall transmission-reception-synchronization-data recovery steps that are carried out during a communication.

DECODING ALGORITHM

Figure 5:
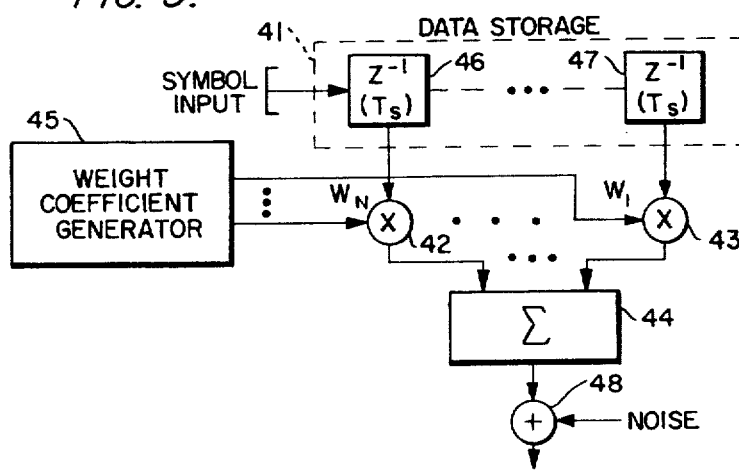
FIG. 5 is a block diagram illustration of an equalizer.

As was explained above, a frame of information assembled and transmitted from the transmitting station is formatted to contain N successive symbols as may be derived from a known symbol sequence (here, a PN code sequence) followed by M successive unknown data symbols. In order to facilitate an understanding of the decoding algorithm employed in accordance with the invention, the successively sampled received values from the dynamic dispersive HF channel may be considered to have been generated by a transversal filter as illustrated in FIG. 5. The transversal filter is shown as comprising a data storage register 41 of length N containing a plurality of storage stages $Z^{-1}$ (only the first stage 46 and the last stage 47 of which are shown in FIG. 5). Each stage stores a respective successive data symbol sample. The contents of each stage of data storage register 41 are coupled to a respective weight multiplier, only the first and last of which, 42 and 43, are shown. These multipliers multiply the contents of register 41 by weighting coefficients supplied from a weight coefficient generator 45. The outputs of multipliers 42 . . . 43 are summed in an adder 44 to produce a data symbol. Weighting coefficient generator 45 operates in accordance with a prescribed measurement/evaluation function and selectively modifies or updates the weight multiplier values supplied to the weight coefficient multipliers 42 . . . 43 in order to simulate the distortion-introducing characteristics of the channel.

Now, although the data recovery algorithm employed in accordance with the present invention is not so simple as the case of a conventional transversal filter processing function briefly discussed above, the transversal filter function is referenced here in order that signal analysis and distortion compensation algorithm to be described below may be more readily appreciated in terms of an analog transversal filter approach.

For the signal transmission scheme of interest, the transmitted and received signal values are complex. The channel weighting factors for the transversal filter function shown in FIG. 5 are both complex and dynamic. In order to implement the algorithm to be described in detail below, it will be initially presumed that the channel weighting factors $W_1 \ldots W_N$ are known and that the transmitted signals can be represented by a set of discrete complex numbers transmitted at the symbol intervals Ts. Channel noise is presumed to be additive and independent from sample to sample.

In accordance with the algorithm employed by the present invention, the transmitted data symbols are subdivided in time into a sequence of known data symbols followed by a sequence of unknown data symbols, which pair of sequences constitutes a frame of transmitted information signals, as described previously with reference to FIG. 1, wherein N known symbols are succeeded by M unknown data symbols. If the memory span of the channel is no greater than $N+1$ symbols, then all of the received samples will be influenced by symbols from only one frame. With the received values $r_i$ and transmitted values $t_j$ being arranged successively as shown in FIG. 1, then the following equation (1) can be written:

$$r_i = \sum_{j=1}^{N+1} W_j t_{i+j-1} + n_i \tag{1}$$

where $W_j$ is the jth weight, and n is the noise created by the channel. (Note that it is assumed that the channel spans $N+1$ samples).

By observing $r_1$ through $r_{M+N}$ the following equation (2) can be written:

$$R = WT + N, \tag{2}$$

where:

R is a column vector with $r_1$ through $r_{N+M}$ as components,

T is a column vector with $t_1$ through $t_{2N+M}$ as components,

N is a column vector with $n_1$ through $n_{N+M}$ as components, and

W is an $N+M \times 2N+M$ matrix of the form:

$$W = \begin{bmatrix} W_1 & W_2 & \ldots & W_{N+1} & 0 & \ldots & 0 \\ & W_1 & W_2 & \ldots & W_{N+1} & \ldots & 0 \\ & & & \vdots & & & \\ 0 & \ldots & W_1 & W_2 & \ldots & W_N & W_{N+1} \end{bmatrix} \begin{array}{c} \updownarrow \\ N+M \\ \downarrow \end{array}$$

$$\longleftarrow 2N+M \longrightarrow$$

Equation (2) involves 2N known transmitted symbols (from the known PN code), M unknown symbols (voice data) and N+1 known (assumed) weight values.

The decoding algorithm employed in accordance with the present invention operates to solve for the values of the M unknown symbols which minimize the sum of the squares of the magnitude of the N+M hypothesized noise values given the N+M received values. This results in a set of calculated transmitted values which do not, in general, correspond to possible transmitted values. To remedy this inaccuracy, the next step is to select those discrete possible transmitted values that are nearest to each of the calculated values.

In order to carry out this "nearest value" selection process equation (2) may be rewritten as:

$$N = W_1 A + W_2 B - R \tag{3}$$

wherein: N and R are column vectors representing noise and received values as indicated previously. In equation (3), the column vector T has been split into two vectors A and B such that the A vector contains the known transmitted symbols and the B vector contains the unknown transmitted symbols, so that a Table 1 may be written as follows:

TABLE 1

| Components of transmitted Vector T | | Corresponding Components in Vectors A and B |
|---|---|---|
| N known values | $t_1$ | $a_1$ |
| | $t_2$ | $a_2$ |
| | . | . |
| | . | . |
| | $t_N$ | $a_N$ |
| M unknown values | $t_{N+1}$ | $b_1$ |
| | $t_{N+2}$ | $b_2$ |
| | . | . |
| | . | . |
| | $t_{N+M}$ | $b_M$ |
| N known values | $t_{N+M+1}$ | $a_{N+1}$ |
| | . | . |
| | . | . |
| | $t_{2N+M}$ | $a_{2N}$ |

From Table 1, it can be seen that vector A contains 2N components ($a_1$-$a_{2N}$) while vector B contains M components ($b_1$-$b_M$).

The matrices $W_1$ and $W_2$ are the respective portions of the W matrix such that:

$$WT = W_1 A + W_2 B \tag{4}$$

From the above, it can be seen that matrix $W_1$ is a 2N by (N+M) matrix consisting of a merger of the first N columns and the last N columns of the W matrix, while $W_2$ is an M by (N+M) matrix consisting of columns N+1 through N+M of the W matrix.

With this formulated definition the solution for the "calculated transmitted values" may proceed. To this end a scaler quantity S, which is the sum of the squares of the magnitudes of the noise components, may be written as:

$$S = N^{*T} N = (W_1 A + W_2 B - R)^{*T} (W_1 A + W_2 B - R) \tag{5}$$

wherein: $X^T$ represents the transpose of the X vector and $X^*$ represents the vector with components which are the conjugate of the components of X. To minimize the sum of the squares, the partial derivative of S with respect to each of the elements of the B vector is set equal to zero. This step produces M equations involving the M calculated values of B, $\hat{B}$, which can be written as:

$$V = 0 = W_2^{*T} W_1 A + W_2^{*T} W_2 \hat{B} - W_2^{*T} R. \tag{6}$$

where V is a vector with components $\partial s/\partial b_1$, $\partial s/\partial b_2$, $\partial s/\partial b_M$, and $\hat{B}$ denotes the calculated or estimated values of B.

Solving for $\hat{B}$ yields:

$$\hat{B} = (W_2^{*T} W_2)^{-1} [W_2^{*T} (R - W_1 A)] \tag{7}$$

Figure 8B:
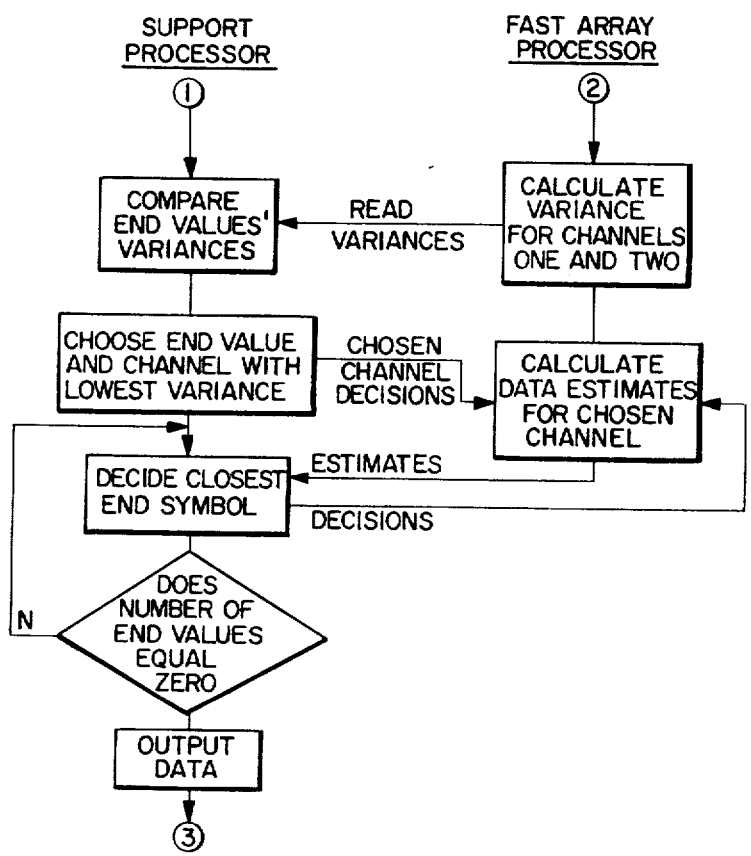
FIGS. 8A–8B illustrate a flow chart of the processing operations performed by the symbol processor of the receiver equipment shown in FIG. 4.
Figure 8A:
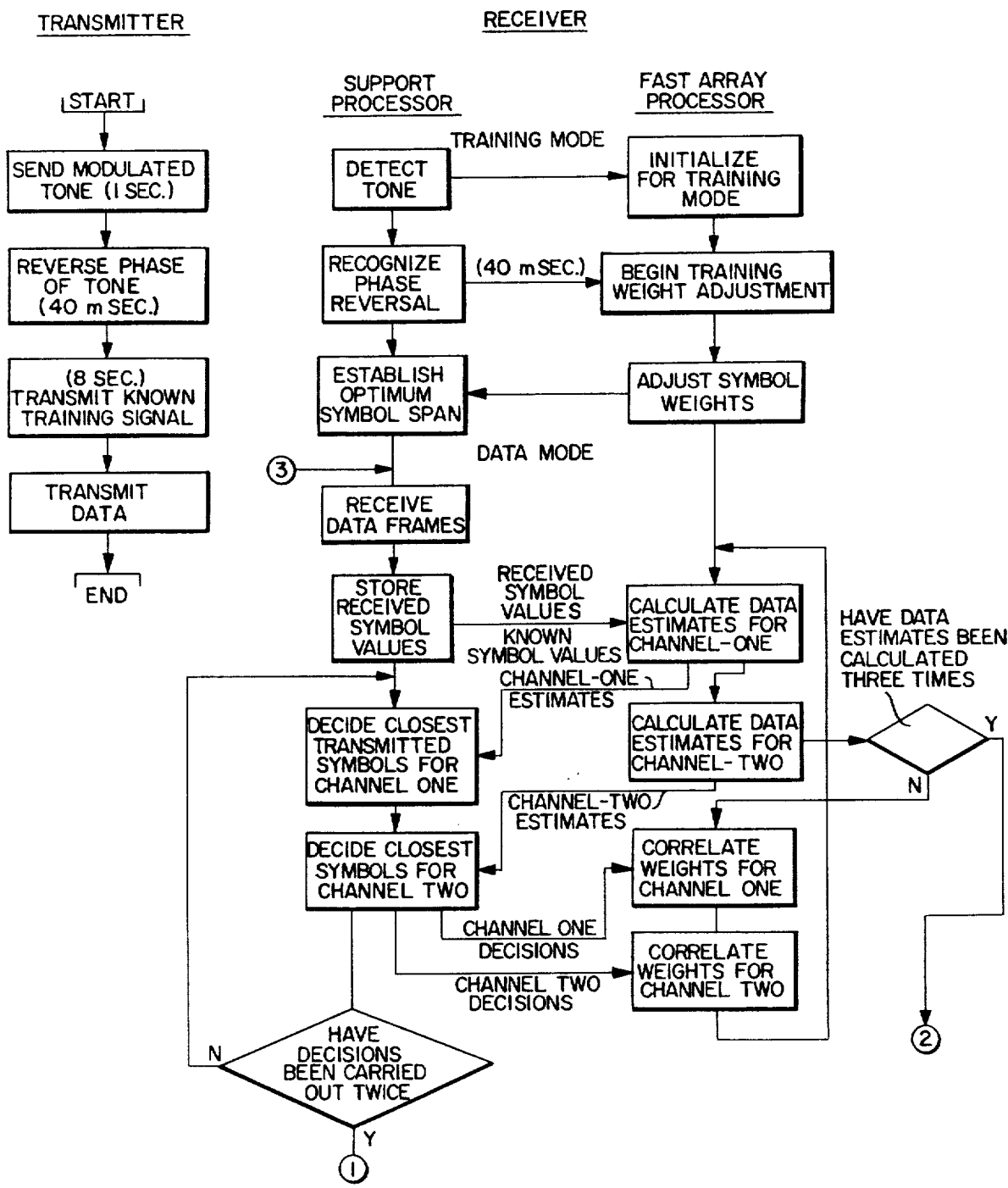

Thus, by implementing equation (7), via processor 37, the operational scenario for which is described below with reference to FIGS. 8A and 8B, estimates of the unknown transmitted values can be calculated as the M components of $\hat{B}$. Given these values, the actually transmitted values are selected by choosing the closest possible transmitted value to each of these calculated values.

From the basic transmitted signal value estimation and selection process it is possible to further refine the eventually chosen data values. The basis for this refinement process can be understood by considering a vector E consisting of the errors in each of the calculated transmitted values:

$$E = B - \hat{B} \tag{8}$$

It can be shown that $$\text{Exp}(EE^{*T}) = \sigma^2 (W_2^{*T} W_2)^{-1} \tag{9}$$

where Exp denotes expectation and $\sigma^2$ is the variance of the additive noise terms $n_1$ through $n_{N+M}$. Equation (9) indicates that the variance of the errors to the individual estimates of $b_i$ are proportional to the diagonal components of the matrix $(W_2^{*T} W_2)^{-1}$. If $\sigma_i$ represents the standard deviation of the error:

$$e_i = b_i - \hat{b}_i \tag{10}$$

then the probability of having made an error in any decision is directly related to $(|b_i - \hat{b}_i|/\sigma)$ if the noise density is unimodal. Although $b_i$ is not known, the decided upon values of $b_i$, $b_{id}$ and the estimates $\hat{b}_i$ are known. Accordingly, refinement of the basic algorithm may be realized by calculating the value of $(|b_{id} - \hat{b}_i|/\sigma_i)$ which is smallest and making a decision on only that $b_i$. This then permits the value of $b_i$ to be considered as a known value. As a result, equation (8) may be recalculated based upon the 2N+1 "known" values and M−1 unknown values. The next most probably correct value of $b_i$ can then be determined and the process repeated until all M unknown transmitted values are decided upon.

A somewhat simpler process, which is employed in accordance with a preferred embodiment of the invention, involves iterating the decisions for the unknown transmitted values. This technique determines which of the two "end values" ($b_{1d}$ or $b_{nd}$) of $b_{id}$ are most likely to be correct. This "most likely correct" value, i.e., the value providing the smallest error, is chosen and the process is iterated, so as to compress the separation between the "known" end values in the manner described above, with the exception that each time the search for the most likely correct decision is restricted to an "end value". This preferred approach simplifies the calculation process considerably. Although the reduction in error rate anticipated from this process should be less than that anticipated from the more complete iterative process, it may be assumed that the loss would generally not be severe by noting that the error variances of the "end values" are generally smaller than those corresponding to interior values. The decisions involving the end terms are less likely to be in error, on an ensemble basis, than the interior decisions.

TRACKING ALGORITHM

As was explained previously, in order to carry out the decision algorithm, some means of determining the channel weights must be provided. In order to accommodate dynamic variations which might be anticipated in the HF channel, the approach taken must have the capability of tracking weight variations in the 1 Hz rate region. Moreover, since the channel signal may fade for relatively long periods during a transmission and the receiver must be able to recover without requiring retraining (since the transmitter site may be unaware of the fade), the selected scheme must be capable of determining channel weights without the use of an initial training mode.

In accordance with the present invention these requirements are satisfied by reestimating the channel weights each frame of data (N known, M unknown data symbols) based upon the decisions and the estimated weights of the previous frame. Assuming, initially, that the weights for the previous frame have been established, the first step is to make a set of decisions using these weights in the algorithm described above. Based upon these decisions, the 2N known transmitted values, and the weights for the previous frame, the N+M received values can be predicted and N+M errors between the prediction and observed received values can be calculated. These errors are then correlated (multiplied and averaged) with the N+M assumed transmitted values corresponding to each of the channel weights in the predictions. The channel weights are updated by a fraction of the correlation; and value of the fraction is the loop gain and is chosen as a compromise between tracking speed and noise performance.

After reestimating the weights, the decision algorithm can be reapplied using these weights, and a new set of weights can be estimated using the decisions from the algorithm. This process is repeated for several frames, after which the decisions become more accurate and the process converges.

SYNCHRONIZATION

As explained previously, in order for the receiver to implement the decision algorithm, it must be provided with knowledge of the M known symbols transmitted during each frame. This requirement is achieved through the use of a local PN generator within the support processor that produces the same PN sequence that is transmitted for each frame of data. In order that the receiver's PN sequence generator will produce its PN sequence in synchronism with the PN sequence that has actually been transmitted, it is initially necessary to transmit a synchronization code or signal sequence which is recognized by the receiver as being the start of a transmission, and through which the receiver turns on its PN generator so that it will be in synchronism with the incoming data.

In wire line modems, the conventional approach to synchronize a local PN generator is to send a training sequence which contains a signal that can be recognized as a start signal for the local PN generator. In a high data rate modem, the procedure consists of a burst of carrier followed by a phase reversal. The receiver identifies the presence of the carrier and then looks for the phase reversal. Upon identifying the phase reversal, the receiver then waits a prescribed number of symbol intervals before starting the local PN generator. For a wire line modem, the telephone channel is such that the variation in the identified time of receipt of the phase reversal is only a few symbols in duration and the span of the equalizer is sufficient to accommodate the variation without a loss in performance.

In addition to the above-referenced scheme of employing a single tone (with phase reversal) for synchronization, in accordance with the present invention it is also envisaged that more than a single tone may be used. The use of two or more tones may be advantageous under those circumstances where the frequency of occurrence of spectral fades in the channel causes the identification of a single tone likely to be unreliable. This difficulty can be circumvented by using two or more tones all of which are phase reversed to indicate the starting time of the local PN generator. Another consideration that may govern the choice of two or more tones is that the time of identification of phase reversal at the receiver may have a time uncertainly equal to the memory span of the channel, which would then double the number of weights that would be required and double the required value of N in the decoding algorithm.

The multi-tone scheme in accordance with the present invention involves the transmission of a training sequence consisting of two or more tones lasting for approximately one second followed by a phase reversal for a fraction of a second. This will then be followed by several seconds of known data. The receiver includes detection circuitry for recognizing the presence of at least one of those tones and detecting the occurrence of the phase reversal in the tone having the largest amplitude. This detection event initiates a process of training a set of weights which set is twice as long as the set of weights to be used in the decoding algorithm during the transmission of data (2N+2 weights). As will be described below, the weight training process follows that used in accordance with the decoding algorithm, except that only the known transmitted values produced by the local PN generator at the receiver are employed in place of decisions, and the frames are doubled in length to allow for the calculation of twice as many weights. At each weight location, the magnitude of the largest value for that weight which has occurred during the training period is stored. Upon termination of the training period, N+1 consecutive weight locations are selected and the framing of received values is adjusted in order that the weights will be properly aligned. From the 2N+2 available weight locations, N+1 weights may be selected to be: (1) the N+1 consecutive locations having the largest sum square weight value, (2) the N+1 consecutive locations such that the largest weight magnitude not included is minimized, or (3) the N+1 consecutive locations which symmetrically surround the centroid of the weight values.

It should be observed that the total time delay in the high frequency channel is expected to remain relatively constant during a transmission, although individual weights are expected to vary up and down considerably. As a result, once the local PN generator in the receiver's processor is initially synchronized, synchronization should remain during the transmission assuming adequate symbol timing is provided. To provide adequate symbol timing and a demodulator carrier, a very stable clock is provided, with the weight tracking algorithm being employed to track phase and time variations caused by differences between transmit and received clock. In order to reduce loss due to inappropriate sampling time during a symbol time, two samples per symbol may be employed, although the algorithm is appropriate to allow computation where only one decision per two samples is made. The algorithm may be employed twice per frame with each of the two symbol sample phases. It is also possible to apply both samples per symbol to the algorithm at the same time. Although this simultaneous application changes the size of the matrix, it may, in fact, reduce calculation time.

Having described the component portions of the communication scheme to be carried out in accordance with the present invention, the following explanation will be directed to the manner in which the invention is implemented, particularly in the symbol processor 37 of the receiver portion of the system shown in FIG. 4, and the operational scenario that is used to detect and decode an incoming message using the algorithm described above. Because of the nature of the computational functions to be solved in the decoding of the data, processor 37 is advantageously comprised of a pair of processors—a support processor (SUPP) and a fast array processor (FAP) that interface and cooperate with each other when operating on incoming messages. The use of two data processors instead of a single unit is predicated upon the types of computational and decisional tasks to be carried out on incoming messages.

As has been described previously, the algorithm embodied in the communication scheme in accordance with the present invention requires a rather large number of calculations among large-sized matrices of complex numbers. To facilitate the data processing functions associated with these calculations, one processor (the fast array processor) is dedicated to performing high density, high speed computational tasks, with data being supplied to and extracted from it via the second processor (the support processor) which also is programmed to provide various control and steering functions to be explained in detail below. The fast array processor may comprise a thirty-two bit complex number multiplier fed from two banks of memory. Addresses for the memory bank can be generated by a controller circuit implemented with a bit slice processor. The support processor may comprise a twelve-bit, bit slice processor that interfaces with the fast array processor via a multi-bit communication bus in accordance with customary data communication techniques. As the details of the individual processors are not the subject matter of the presennt invention and an explanation of the circuitry and interconnections thereof are not necessary for an understanding of the communication scheme embodied herein, such details will not be described here. Instead, in order to facilitate an explanation of the communication scheme and thereby more readily enable one skilled in the art to carry out an implementation, the description to follow will focus on the functional tasks to be carried out by each processor in conjunction with the other components of the system, as well as the sequence of events through which implementation of the communication scheme in accordance with the present invention is achieved. Thus, in place of a detailed circuit diagram and its attendant description, the presentation of the invention to follow will be by way of reference to and explanation of an operational flow chart illustrated in FIGS. 8A and 8B, referencing computational and control functions to be performed by the fast array and support portions of the symbol processor during message detection and decoding. During the description, the manner in which the component portions of the communication scheme in accordance with the present invention are integrated with one another will be particularly explained, so as to afford a complete understanding and appreciation of the novel communication scheme.

TRANSMISSION INITIALIZATION

Figure 6:
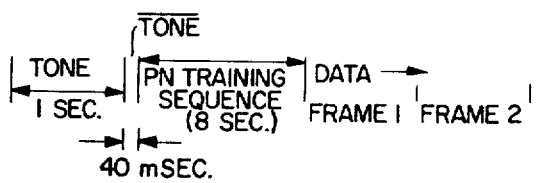
FIG. 6 is a timing diagram illustrating an initialization sequence employed by the present invention prior to transmission and data recovery.

As was explained previously, before tracking of an incoming message can commence, the receiver must be synchronized with the framing sequence contained in the message and a training mode for establishing weighting coefficients must be carried out. To briefly recapitulate, each frame of a message contains a plurality N of known symbols followed by a plurality M of unknown symbols (i.e. the actual data to be recovered). Referring to FIGS. 8A and 8B, when a message is to be sent from the transmitter site to the receiver site, tone signal generating equipment at the transmitter is activated to produce a set of modulated tones of a finite duration (e.g. 1 sec.) proceeded by a phase reversal of the tones for a much shorter period (e.g. 40 m sec. as shown in FIG. 6). For this purpose, and referring again to FIG. 2, during the initialization sequence two or more tones of respectively different frequencies from tone generator 21 are coupled directly and via an inverter 22 to a multiplexer 12 the output of which is coupled to modulator 18 (FIG. 2). Tone generator 21 and multiplexer 12 are selectively controlled by timing signals SYNC 6 and SYNC 7 so as to couple the noninverted output of tone generator 21 to modulator 18 for the exemplary 1 sec. duration followed by tone phase reversal, via inverter 22, for the shorter 40 m sec. duration. This initial tone signal sequence is applied to HF transmitter 19 and transmitted to the receiver station.

At the receiver station, shown in FIG. 4, the demodulated tone sequence that is applied to processor 37 is detected by the support processor, to initiate the succeeding events that make up the signal recovery scheme. More specifically, in the support processor, as successively supplied digital words representative of the reference tones are received from demodulator 34, they are recognized and the support processor begins looking for the phase reversal. At the same time, the support processor transmits a message over the interprocessor bus to the fast array processor causing the fast array processor to enter a training mode, i.e. to prepare itself to receive the locally generated known data symbols and the received known data symbols through which the weights of the matrix calculations will be initially established.

When phase reversal of an incoming tone occurs, the support processor times out for a finite period of time corresponding to the apriori known transmitted interval of the tone phase reversal and then begins supplying a local PN code to the fast array processor for calculation of symbol weights. More specifically, as was explained previously, before unknown data can be reconstructed, the signal processing algorithm employed in accordance with the present invention must be initialized with respect to channel weights. For a symbol span of $M=20$ symbols in each frame of data there will be twenty weights to be initially established or estimated prior to the reception of actual unknown data. Unfortunately, because of unknown delay characteristics of the high frequency channel, the point in time at which tone phase reversal has been detected by the support processor may be retarded or advanced relative to the 40 m sec duration at the expiration of which the known PN code training signal is expected to appear. To accommodate this possibility and practical probability, the symbol span over which the algorithm weights are established is expanded to cover a subframe in advance of and delayed relative to the symbol span of interest (i.e. twenty symbols) for a total of sixty symbols.

As explained above, for the purpose of initializing or training the fast array processor prior to receiving unknown data, a known (PN code) data or symbol sequence is transmitted over the HF channel subsequent to tone phase reversal for a finite period of time. This is shown in FIG. 6, wherein at a time 40 m sec subsequent to the time at which tone reversal occurred, sync generator 13 applies a timing signal designated SYNC 7 to PN sequence generator 17 so that a training PN sequence is transmitted from the transmitter site to the receiver site for the eight second initialization period.

Within the symbol processor 37 at the receiver site, the fast array processor begins calculating channel weights for the sixty symbol equalization function span as the detected PN symbols are delivered from demodulator 34 and the corresponding known PN sequence is supplied from the support processor to the fast array processor. As symbol weights are calculated by the fast array processor over the sixty symbol span, in accordance with the decoding algorithm detailed previously, symbol weight values $W_1 \ldots W_{60}$ are generated over the equalizer span. Pursuant to the initialization scheme embodied in the present invention, the support processor observes the values of each symbol weight as they fluctuate during the decoding process carried out by the fast array processor, and it stores the largest weight observed for each symbol within the sixty symbol span. At the end of the training interval, the support processor designates those $N+1$ (21) consecutive symbols within the sixty symbol span, whose weight values satisfy one of the above described criteria for the training interval. Namely, (1) the $N+1$ consecutive locations with the largest sum square weight value, (2) the $N+1$ consecutive locations such that the largest weight magnitude not included is minimized, or (3) the $N+1$ consecutive locations symmetrically surrounding the centroid of the weight values. These selected $N+1$ (twenty-one) symbols are chosen as the symbol locations for the equalization function decoding algorithm. Namely, the process conducted is equivalent to that involved with training an adaptive equalizer in which the time synchronization of the local PN generator in the receiver establishes the location of a weight pattern in the equalizer. An error in establishing the starting time of the local PN generator (here the PN generator within the support processor) simply moves the weight pattern in the equalizer. Fortunately, with an equalizer function span of 60 symbols, there is adequate room for a considerable time error in starting the PN generator subsequent to detection of phase reversal. At the end of the training period, $N+1$ (21) consecutive weight locations among the sixty are identified by the support processor, as explained above, and the framing of subsequent received data values will be adjusted so that these weights are aligned properly.

DATA TRANSMISSION MODE

Referring again to the data transmission timing diagram shown in FIG. 6, upon the termination of the training sequence the transmission of successive frames of symbols (N known symbols followed by M unknown symbols) is begun. For purposes of the present exemplary embodiment, with an equalizer symbol span of twenty-one symbols, both M and N are made equal to twenty, so that for each frame of data there are twenty known symbols produced by the PN sequence generator followed by twenty symbols of unknown data.

Figure 7:
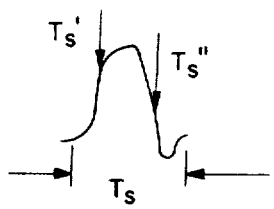
FIG. 7 illustrates an exemplary data signal subjected to a pair of sampling times.

Considering now the operation of the receiver during data reception and recovery, from demodulator 34 successive received symbol values are coupled to symbol processor 37. As was explained previously, for each symbol time, demodulator 34 provides a pair of symbol value codes as measured during discrete sample times within a symbol interval. More specifically, as shown in FIG. 7, the characteristics of a received symbol are subject to the distortion of the HF channel and therefore are assumed not to be "clean" signals, so that the time at which the signal is sampled to provide a digital output code to be supplied to the symbol processor may itself contribute to the accuracy or inaccuracy of the signal processing scheme implemented in the symbol processor. An illustration of this signal value differential is presented in FIG. 7, wherein a demodulated PAM sampled signal value has different amplitude values at times $T'_s$ and $T''_s$ respectively. For this reason, the analog-digital converter within demodulator 34 samples each demodulated symbol twice during each symbol interval $T_s$, as at times $T'_s$ and $T''_s$ shown in FIG. 7 and supplies these two values to support processor (SUPP) 37B within symbol processor 37. The separate times at which the demodulated signal values are sampled may be considered to correspond to separate signal channels, so that demodulator 34 supplies digital codes for successive received symbols over a pair of channels 1 and 2, for example.

Within the support processor 37B output symbol codes from demodulator 34 are buffered in a pair of memories as they are received. When support processor 37B has received a full frame of symbols, (twenty known PN sequence symbols followed by twenty unknown data symbols) it supplies both these forty received symbol values for channel-one plus the twenty values supplied by the local PN code generator, known to have been transmitted, to the fast array processor (FAP) 37A. The fast array processor 37A now proceeds to carry out the decoding algorithm matrix calculations described previously and produces a set of twenty estimates of the transmitted values for the twenty unknown symbols for the channel-one samples. This set of twenty estimates is stored in support processor 37B, as the forty received sample codes for channel-two plus the codes for the twenty known PN sequence symbols are supplied from SUPP 37B to FAP 37A for processing.

Figure 9:
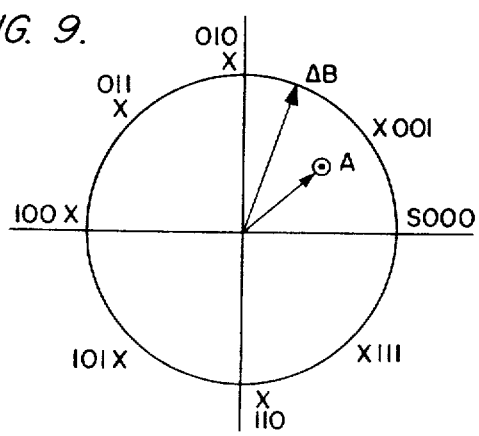
FIG. 9 is a phase node plot for eight-ary PSK signals.

During the interval that FAP 37A is carrying out the decoding algorithm matrix calculations on the channel-two samples, SUPP 37B examines the stored channel-one estimates and compares these codes with those corresponding to the code values capable of being transmitted. Thus, for example, for an eight-valued PAM signal (capable of being originally encoded into three binary bits) SUPP 37B compares the channel-one estimates with the eight amplitude levels that it knows could have been transmitted, and then stores that one of the eight values that is closest to or has the smallest differential separation from the symbol estimate. As another example, for an eight-ary PSK transmission scheme, this would consist of choosing the phase node closest to that represented by the symbol estimate provided by FAP 37A. An illustration of the effect of thus-far described decision process as applied to an eight-ary PSK transmission scheme is shown in FIG. 9. The "Xs" on the transmission phase plot represent possible transmitted node values for message symbols. Location A represents the sampled value for channel-one supplied by demodulator 34 to processor 37. As can be seen from FIG. 9, if one were to simply choose the closest possible node to point A without correcting for channel distortion, one would select the $\pi/4$ node (code value 001). However, through the matrix calculations provided by FAP 37A where an estimate at location B is obtained, the closest node is $\pi/2$ or code value 010.

Once FAP 37A has completed its matrix calculations on the channel-two samples to provide a new set of data estimates, it sends these estimates to the SUPP 37B just as it did for the channel-one calculations. SUPP 37B, in turn, next sends the decisions it has made on the channel-one estimates, namely, the possible transmitted symbol values for channel-one, to FAP 37A for updating the channel weights in accordance with the weight updating algorithm described previously. As FAP 37A carries out the weight updating calculations on the basis of the channel-one decisions, SUPP 37B makes decisions as to possible transmitted values for the channel-two estimates and also advances the PN generator to be ready for a new set of data symbol sample codes to be supplied from demodulator 34. After SUPP 37B has completed the decision process for channel-two estimates, it sends the channel-two decisions to FAP 37A for the purpose of updating the channel-two weighting coefficients. The above described sequence of events constitutes one complete cycle of the symbol calculation process that may be carried out for each frame of received symbols. Advantageously, the data decoding algorithm, symbol estimate and correlation cycle is implemented a plurality of times for each frame in order to refine the symbol decisions for the two channels.

More specifically, once the channel weighting coefficients have been updated by the correlation portion of the algorithm, the initial decisions are applied to FAP 37A as though they were unknown symbols and the matrix calculations are again carried out, followed by decision process by SUPP 37B and the weight coefficient correlation steps carried out by FAP 37A. It has been found that this repetition procedure has the ability to enable more accurate estimates of transmitted symbols and updating of channel weights to be obtained, and it is repeated a third time for the estimate calculations and decisions by FAP 37A and SUPP 37B, respectively. This is a particularly advantageous feature of the present invention as it, in effect, enables the data decoding algorithm to "pull itself up by its own bootstraps". Without processing time limitations, the number of cycles of the above described sequence of events that may be carried out is infinite. However, for practical purposes using present day processing speeds and still providing a usefully accurate set of decoded symbols, it has been found that the cycle may be repeated one and one-half times; namely, during the third cycle, the correlation process for updating the channel weights is omitted.

At the end of the symbol decoding refinement process, SUPP 37B, which now contains in memory twice-refined decisions for the twenty unknown symbols for each of channels one and two, proceeds to evaluate the accuracy of the decisions obtained for the respective channels using the variance portion of the algorithm described previously, and chooses the decisions for that channel for which the variance measured for an end symbol is smallest. More specifically, as described previously in connection with the explanation of the decoding algorithm, with reference to equations (9) and (10), refinement of the basic algorithm may be realized by calculating the value of $(|b_{id}-b_i|/\sigma_i)$ which is smallest and making a decision on only that $b_i$. This then allows the processor to consider the value of $b_i$ as a known value. This known value may then be used in an iterative process which is repeated until all M unknown transmitted values are decided upon. While satisfactory at lower speeds, at high speeds the processing time required for this approach does not permit the further refinement process to be realized at the data rates of interest. However, this calculation of the ratio of error differential to variance may be used as a starting point for the further decision refinement process starting with the "end" values of the set of twenty unknown symbol decisions.

More specifically, for each of the calculated end symbol values for each channel, i.e. $b_{1-1}$, $b_{1-20}$ and $b_{2-1}$, $b_{2-20}$, the value of $(|b_{id}-\hat{b}_i|/\sigma_i)$ is provided to the support processor. SUPP 37B then chooses that channel an end value of which produces the lowest calculated ratio and further designates the decision corresponding to this end value having the lowest calculated ratio as an a priori known transmitted symbol. The reason for choosing an end value as a known value is the fact that fluctuations within the symbol span occur more dramatically in the middle of the span, whereas the estimates at the ends are subjected to only minor perturbations.

Within the set of twenty decisions presently stored in the support processor, one symbol value has thus been designated to be known and only nineteen symbols are now still unknown. The information presently available to the fast array processor includes nineteen unknown symbol decisions and one designated known decision among the twenty data symbols to be decided upon. FAP 37A proceeds through the decoding algorithm and provides data estimates for only the two end values of the nineteen unknowns. SUPP 37B chooses that one of these new end values having the lowest error ratio, explained above, as a new known value, and the process is repeated, now using eighteen unknown and two known values. For each successive calculation step, the number of knowns increases while the number of unknowns decreases. This reiterative procedure is carried out a total of N or twenty times until the finally decided upon transmitted symbols among the twenty unknowns for the frame of interest is obtained. These twenty symbols are now read out of support processor 37B at a rate complementary to the original compression rate at the transmitter site and applied to a message output device, such as a CVSD 38, shown in FIG. 4, and symbol processor 37 next proceeds to process the succeeding frame of symbol samples provided by demodulator 34. The signal processing time of the support and fast array processors is such that as the last symbol of the previous set of data estimates is read out of processor 37 and coupled to CVSD at an expanding read-out speed, the first symbol of the next succeeding frame (which is an end symbol) is ready to be read-out.

As will be appreciated from the foregoing description, the novel channel distortion compensation and data recovery scheme in accordance with the present invention takes advantage of the separability of variable speed signal processing techniques to implement an adaptive filtering process capable of handling very high rate data. As a result, the system can faithfully transmit digitally encoded voice using inexpensive encoding and decoding devices while achieving a data rate of 8K bps or higher.

While we have shown and described several embodiments in accordance with the present invention, it is understood that the same is not limited thereto but is susceptible of numerous changes and modifications as known to a person skilled in the art, and we therefore do not wish to be limited to the details shown and described herein but intend to cover all such changes and modifications as are obvious to one of ordinary skill in the art.

What is claimed is:

1. A communication system for communicating information signals from a transmitting station to a receiving station over a dispersive medium, comprising:

transmitting apparatus, disposed at said transmitting station, for transmitting information signals interleaved with known signals; and receiving apparatus, disposed at said receiving station, for receiving the transmitted signals subject to the influence of said dispersive medium and providing estimates of the originally transmitted information signals, said receiving apparatus comprising:

means for generating a replica of said known signals, time domain processing means for simulating the time domain effect of said dispersive medium on signals transmitted through it by deducing prescribed characteristics of said medium, and for producing estimates of said information signals in accordance with a preselected relationship between said prescribed characteristics of said simulated effect and said known and received signals, and output conversion means, coupled to said processing means, for converting said estimates of said information signals into output signals representative of the original information signals at said transmitting station.

2. A communication system according to claim 1, wherein said processing means includes means for simulating the effect of said dispersive medium by an equalization function through which dispersive characteristics of said medium are defined and for producing, as estimates of said information signals, those information signals capable of being transmitted which are closest to information signals the values of which for which minimize the sum of the squares of the magnitude of successive sets of noise signals corresponding to received information and known signals, calculated in accordance with said prescribed relationship.

3. A communication system according to claim 2, wherein said information signals and said known signals are interleaved in sets of signals to form successive frames of transmitted signals, each frame comprising N known signals followed by M unknown signals, said equalization function being defined so that each received signal value $r_i$ may be defined by $$r_i = \sum_{j=1}^{N+1} W_j t_{i+j-1} + n_i,$$

where $W_j$ is the jth weighting coefficient of said equalization function, $t_j$ is the value of the jth transmitted signal, $n_i$ is the noise created by said dispersive medium, and the symbol span of said equalization function is $N+1$ symbols.

4. A communication system according to claim 3, wherein said receiving apparatus further includes means for sampling each received signal a plurality of times, and said processing means includes means for processing each of said signal samples to derive, as said estimates, those chosen information signals whose samples result in minimizing the sum of the squares of the magnitudes of successive pluralities of noise signals corresponding to sampled values of received information and known signals.

5. A communication system according to claim 3, wherein said processing means includes means for modifying the weighting coefficients of said equalization function for each frame of received signals based upon M information signals and estimated weighting coefficients of a previous frame.

6. A communication system according to claim 5, wherein said weighting coefficients modifying means includes means for updating the weighting coefficient of said equalization function by a fraction of the correlation of the errors between the received signal values and calculated signal values based upon said M information signals, the 2N known values for the frame of interest and the previous frame, and the weighting coefficients of the previous frame.

7. A communication system according to claim 1, wherein said information signals and said known signals are interleaved in successive pluralities of information and known signals to form successive frames of transmitted signals, each frame containing a first plurality of N known signals and a second plurality of M information signals, one of said first and second pluralities of signals immediately succeeding the other of said first and second pluralities of signals so that there is no gap therebetween.

8. A communication system according to claim 7, wherein said known signals comprise a pseudo noise signal sequence.

9. A communication system according to claim 1, wherein said processing means includes means for synchronizing the replica of said known signals generated by said generating means with the known signals contained in the transmitted signals as received by said receiving apparatus.

10. A communication system according to claim 9, wherein said processing means includes means for simulating the effect of said dispersive medium by generating an equalization function through which dispersive characteristics of said medium are simulated, the symbol span of said equalization function being originally greater than the memory span of the dispersive medium, and wherein said synchronizing means includes means for causing said equalization function to be established over a symbol span, approximating the memory span of said dispersive medium, over which weighting coefficients of said equalization function undergo a prescribed adjustment in response to the receipt of a sequence of known signals transmitted from said transmitting apparatus over a prescribed period of time.

11. A communication system according to claim 10, wherein said transmitting apparatus further includes means for transmitting at least one prescribed tone for a first preselected period of time followed by phase reversal of said at least one tone for a second preselected period of time, the transmission of said prescribed sequence of known signals following the termination of phase reversal of said at least one tone at the end of said second preselected period of time, and at said receiving station said processing means includes means for detecting said at least one tone, including the phase reversal associated therewith, and commencing the adjustment of the weighting coefficients of said equalization function at the termination of a period of time corresponding to said second preselected period of time subsequent to detection of phase reversal of said at least one tone.

12. A communication system according to claim 11, wherein within said processing means, during synchronization, the weighting coefficients of said equalization function are adjusted so as to minimize the sum of the squares of the magnitudes of plural noise signal values associated with plural signals in said replica of known signals, the number of which corresponds to the number of signals in successive frames of transmitted signals.

13. A communication system according to claim 12, wherein within said processing means, during synchronization, said equalization function is defined so that each received signal value $r_i$, corresponding to a known signal within said replica of known signals, may be defined by the relationship:

$$r_i = \sum_{j=1}^{2N+2} W_j t_{i+j-1} + n_i,$$

where $W_j$ is the jth weighting coefficient of said equalization function, $t_j$ is the value of the jth transmitted signal, $n_i$ is the noise created by said dispersive medium, and the symbol span of said equalization function is $2N+2$ symbols in length.

14. A communication system according to claim 10, wherein said information signals and said known signals are interleaved in successive pluralities of information and known signals to form successive frames of transmitted signals, each frame containing a first plurality of N known signals and a second plurality of M information signals, one of said first and second pluralities of signals immediately succeeding the other of said first and second pluralities of signals so that there is no gap therebetween.

15. A communication system according to claim 14, wherein the symbol span of said equalization function is associated with those $N+1$ consecutive symbol locations within said original symbol span the weighting coefficients of which produces the largest sum of the squares value.

16. A communication system according to claim 14, wherein the symbol span of said equalization function is associated with those $N+1$ consecutive symbol locations within said original symbol span such that the largest weighting coefficient magnitude not included in minimized.

17. A communication system according to claim 14, wherein the symbol span of said equalization function is associated with those $N+1$ consecutive symbol locations within said original symbol span symmetrically surrounding the centroid of the values of the weighting coefficients.

18. A communication system according to claim 1, wherein said time domain processing means includes means for calculating said estimates of the transmitted values of said information signals in accordance with a relationship that is algebraically equivalent to the expression:

$$\hat{B} = (W_2^{*T} W_2)^{-1} (W_2^{*T} (R - W_1 A)),$$

wherein: R may be represented as a column vector having a preselected number of received signal values as elements, definable by the equation $R = WT + N$, T being a column vector with a prescribed number of transmitted signal values as elements, N being a column vector having a predetermined number of noise values as elements, and W being a prescribed weighting coefficient matrix containing a preestablished number of weighting coefficients, si that $W_1$, $W_2$, A and B may be expressed by the equation $WT = W_1 A + W_2 B$, wherein vectors A and B respectively correspond to those portions of said T column vector containing the transmitted known signals and transmitted information signals, and $\hat{B}$ denotes the calculated values of B.

19. A communication system according to claim 18, wherein said receiving apparatus further includes means for sampling each received signal a plurality of times interval thereby obtaining plural channels of received signal values, and signal processing by said processing means is carried out for each of said channels and said processing means further includes means for producing an estimate of an information signal by choosing that information signal capable of being transmitted which is closest to an end one of the $b_1 - b_m$ values of $\hat{B}$ for that channel for which $(|b_{id} - \hat{b}_i|/\sigma_i)$ is smallest, where $\hat{b}_i$ is a respective one of the calculated values of $\hat{B}$, $b_{id}$ is a chosen information signal value corresponding to the calculated value $\hat{b}_i$, and $\sigma$ is the standard deviation of the error $e_i = b_i - \hat{b}_i$, to correspond to said end value, and successively reiterating the equation defining $\hat{B}$ with newly decided end values of $\hat{B}$ considered as known values, for that channel only, until transmitted information signals for each of said M information signals per frame have been chosen.

20. A communication system according to claim 18, wherein said processing means includes means for producing as said estimates of said information signals those information signals capable of being transmitted for which the ratio of $(|b_{id}-\hat{b}_i|/\sigma_i)$ is smallest, where $\hat{b}_i$ is a respective one of the calculated values of $\hat{B}$, $b_{id}$ is a chosen information signal value corresponding to the calculated value $\hat{b}_i$, and $\sigma_i$ is the standard deviation of the error $e_i = b_i - \hat{b}_i$, $\sigma 2$ being the variance of the additive noise terms $n_1$ through $n_{N+M}$, with the equation defining $\hat{B}$ being reiterated successively with new values of $b_i$ being considered as known values, until transmitted information signals for each of said M information signals per frame have been chosen.

21. A communication system according to claim 18, wherein said processing means includes means for producing estimates of an information signal by choosing that information signal capable of being transmitted which is closest to an end one of the $b_1 - b_m$ values of $\hat{B}$ for which $(|b_{id}-\hat{b}_i|/\sigma_i)$ is smallest, where $\hat{b}_i$ is a respective one of the calculated values of $\hat{B}$, $b_{id}$ is a chosen information signal value corresponding to the calculated value $\hat{b}_i$, and $\sigma$ is the standard deviation of the error $e_i = b_i - \hat{b}_i$, to correspond to said end value, and successively reiterating the equation defining $\hat{B}$ with newly decided end values of B considered as known values, until transmitted information signals for each of said M information signals per frame have been chosen.

22. A communication system according to claim 18, wherein said processing means includes means for modifying the weighting coefficients of said equalization function for each frame of received signals based upon M information signals and estimated weighting coefficients of a previous frame.

23. A communication system according to claim 22, wherein said weighting coefficients modifying means includes means for updating the weighting coefficient of said equalization function by a fraction of the correlation of the errors between the received signal values and calculated signal values based upon said M information signals, the 2N known values for the frame of interest and the previous frame, and the weighting coefficients of the previous frame.

24. A communication system according to claim 22, wherein said processing means includes means for synchronizing the replica of said known signals generated by said generating means with the known signals contained in the transmitted signals as received by said receiving apparatus.

25. A communication system according to claim 24, wherein said processing means includes means for simulating the effect of said dispersive medium by generating an equalization function through which dispersive characteristics of said medium are simulated, the symbol span of said equalization function being originally greater than the memory span of the dispersive medium, and wherein said synchronizing means includes means for causing said equalization function to be established over a symbol span, approximating the memory span of said dispersive medium, over which weighting coefficients of said equalization function undergo a prescribed adjustment in response to the receipt of a sequence of known signals transmitted from said transmitting apparatus over a prescribed period of time.

26. A communication system according to claim 25, wherein said information signals and said known signals are interleaved in successive pluralities of information and known signals to form successive frames of transmitted signals, each frame containing a first plurality of N known signals and a second plurality of M information signals, one of said first and second pluralities of signals immediately succeeding the other of said first and second pluralities of signals so that there is no gap therebetween.

27. A communication system according to claim 18, wherein said receiving apparatus further includes means for sampling each received signal a plurality of times, and said processing means includes means for calculating said estimates on the basis of the sampled signal values.

28. A communication system according to claim 18, wherein said information signals and said known signals are interleaved in successive pluralities of information and known signals to form successive frames of transmitted signals, each frame containing a first plurality of N known signals and a second plurality of M information signals, one of said first and second pluralities of signals immediately succeeding the other of said first and second pluralities of signals so that there is no gap therebetween.

29. A communication system according to claim 28, wherein said known signals comprise a pseudo noise signal sequence.

30. A communication system according to claim 18, wherein said receiving apparatus further includes means for sampling each received signal a plurality of times thereby obtaining plural channels of received signal values, and signal processing by said signal processing means is carried out for each of said channels and said processing means further includes means for producing an estimate of an information signal by choosing that information signal capable of being transmitted which is closest to an end of the $b_1 - b_m$ values of $\hat{B}$ for that channel for which a prescribed calculated error is smallest, to correspond to said end value, and successively reiterating the expression defining $\hat{B}$, with newly decided end values of $\hat{B}$ considered as known values, for that channel only, until transmitted information signals for each of said M information signals per frame have been chosen.

31. A communication system according to claim 18, wherein said processing means includes means for simulating the effect of said dispersive medium by generating an equalization function through which dispersive characteristics of said medium are deduced, the symbol span of said equalization function being originally greater than the memory span of the dispersive medium, and wherein said synchronizing means includes means for causing said equalization function to be established over a symbol span, approximating the memory span of said dispersive medium, over which weighting coefficients of said equalization function undergo a prescribed adjustment in response to the receipt of a sequence of known signal transmitted from said transmitting apparatus over a prescribed period of time.

32. A communication system according to claim 31, wherein said information signals and said known signals are interleaved in successive pluralities of information and known signals to form successive frames of transmitted signals, each frame containing a first plurality of N known signals and a second pluralities of M information signals, one of said first and second pluralities of signals immediately succeeding the other of said first and second pluralities of signals so that there is no gap therebetween.

33. A communication system according to claim 1, wherein said time domain processing means includes means for simulating the effect of said dispersive medium by an equalization function through which dispersive characteristics of said medium are deduced.

34. A communication system according to claim 33, wherein said information and said known signals are interleaved in sets of signals to form successive frames of transmitted signals, each frame comprising N known signals followed by M unknown signals, said equalization function being defined so that each received signal value $r_i$ may be defined by $$r_i = \sum_{j=1}^{N+1} W_j t_{i+j-1} + n_i,$$

where $W_j$ is the jth weighting coefficient of said equalization function, $t_j$ is the value of the jth transmitted signal, $n_i$ is the noise created by said dispersive medium, and the symbol span of said equalization function is N+1 symbols.

35. A communication system according to claim 33, wherein said processing means includes means for synchronizing the replica of said known signals generated by said generating means with the known signals contained in the transmitted signals as received by said receiving apparatus.

36. A communication system according to claim 35, wherein said processing means includes means for simulating the effect of said dispersive medium by generating an equalization function through which dispersive characteristics of said medium are deduced, the symbol span of said equalization function being originally greater than the memory span of the dispersive medium, and wherein said synchronizing means includes means for causing said equalization function to be established over a symbol span, approximating the memory span of said dispersive medium, over which weighting coefficients of said equalization function undergo a prescribed adjustment in response to the receipt of a sequence of known signal transmitted from said transmitting apparatus over a prescribed period of time.

37. A communication system according to claim 36, wherein said transmitting apparatus further includes means for transmitting at least one prescribed tone for a first preselected period of time followed by phase reversal of said at least one tone for a second preselected period of time, the transmission of said prescribed sequence of known signals following the termination of phase reversal of said at least one tone at the end of said second preselected period of time, and at said receiving station said processing means includes means for detecting said at least one tone, including the phase reversal associated therewith, and commencing the adjustment of the weighting coefficients of said equalization function at the termination of a period of time corresponding to said second preselected period of time subsequent to detection of phase reversal of said at least one tone.

38. A communication system according to claim 37, wherein said time domain processing means includes means for calculating said estimates of the transmitted values of said information signals in accordance with a relationship that is algebraically equivalent to the expression:

$$\hat{B} = (W_2 {}^T W_2)^{-1} (W_2 {}^T (R - W_1 A)),$$

wherein: R may be represented as a column vector having a preselected number of received signal values as elements, definable by the equation $R = WT + N$, T being a column vector with a prescribed number of transmitted signal values as elements, N being a column vector having a predetermined number of noise values as elements, and W being a prescribed weighting coefficients matrix containing a preestablished number of weighting coefficients, so that $W_1$, $W_2$, A and B may be expressed by the equation $WT = W_1 A + W_2 B$, wherein vectors A and B respectively correspond to those portions of said T column vector containing the transmitted known signals and transmitted information signals, and B denotes the calculated values of B, and within said time domain processing means, during synchronization, the weighting coefficients of said equalization function are established in accordance with said expression.

39. A communication system according to claim 38, wherein within said processing means, during synchronization, said equalization function is defined so that each received signal value $r_i$, corresponding to a known signal within said replica of known signals, may be defined by the relationship:

$$r_i = \sum_{j=1}^{2N+2} W_j t_{i+j-1} + n_i,$$

where $W_j$ is the jth weighting coefficient of said equalization function, $t_j$ is the value of the jth transmitted signal, $n_i$ is the noise created by said dispersive medium, and the symbol span of said equalization function is 2N+2 symbols in length.

40. A communication system according to claim 36, wherein said information signals and said known signals are interleaved in successive pluralities of information and known signals to form successive frames of transmitted signals, each frame containing a first plurality of N known signals and a second plurality of M information signals, one of said first and second pluralities of signals immediately succeeding the other of said first and second pluralities of signals so that there is no gap therebetween.

41. A communication system according to claim 33, wherein said processing means includes means for modifying the weighting coefficients of said equalization function for each frame of received signals based upon M information signals and estimated weighting coefficients of a previous frame.

42. A communication system according to claim 4, wherein said weighting coefficients modifying means includes means for updating the weighting coefficients of said equalization function by a fraction of the correlation of the errors between the received signal values and calculated signal values based upon M transmitted information signals, the 2N known values for the frame of interest and the previous frame, and the weighting coefficients of the previous frame.

43. A communication system according to claim 41, wherein said weighting coefficients modifying means includes means for updating the weighting coefficients of said equalization function by a fraction of the correlation of the errors between the received signal values and calculated signal values based upon the M transmitted information signals, the 2N known values for the frame of interest and the previous frame, and the weighting coefficients of the previous frame.

44. A communication system according to claim 41, wherein said processing means includes means for synchronizing the replica of said known signals generated by said generating means with the known signals contained in the transmitted signals as received by said receiving apparatus.

45. A communication scheme for communicating information symbols from a transmitting station to a receiving station, said information symbols being originally unknown at said receiving station, over a dispersive medium, comprising the steps of:

transmitting, from said transmitting station, said information symbols interleaved with additional symbols, said additional symbols being known at the receiving station;

receiving, at said receiving station, the interleaved known and unknown symbols transmitted from said transmitting station over said dispersive medium;

generating, at said receiving station, a replica of said known symbols; and processing the symbol values received at said receiving station by simulating the effect of said dispersive medium by generating an equalization function defining the dispersive characteristics of said medium and producing, as estimates of said information symbols, those information symbols capable of being transmitted which are closest to information symbols the values of which minimize the sum of the squares of the magnitudes of successive pluralities of noise signals corresponding to received information and known symbols, calculated in accordance with the prescribed relationship between said simulated effect and said known and received symbol values.

46. A communication scheme according to claim 45, wherein said information and known symbols are interleaved in successive pluralities of information and known symbols to form successive frames of transmitted symbols, each frame containing a first plurality of N known symbols and a second plurality of M information symbols, one of said first and second pluralities of symbols immediately succeeding the other and successive frames of symbols immediately succeeding each other.

47. A communication scheme according to claim 45, wherein said information and said known symbols are assembled in respective pluralities of M and N symbols each, thereby forming a frame of symbols, successive frames being transmitted, and wherein said equalization function is defined so that each received symbol value $r_i$ may be defined by the relationship;

$$r_i = \sum_{j=1}^{N+1} W_j t_{i+j-1} + n_i,$$

where $W_j$ is the jth weighting coefficient of said equalization function, $t_j$ is the value of the jth transmitted symbol, $n_i$ is the noise created by said dispersive medium, and the symbol span of said equalization function is N+1 symbols in length.

48. A communication scheme according to claim 47, wherein said known symbols are derived from a pseudo-noise symbol sequence.

49. A communication scheme according to claim 47, further including the step of synchronizing, at said receiving station, the generation of said replica of said known symbols with the known symbols contained in the transmitted symbols as received at said receiving station.

50. A communication scheme according to claim 49, wherein said synchronizing step comprises the steps of:

transmitting for a predetermined period of time from said transmitting station, a prescribed sequence of known symbols, said prescribed sequence being known at said receiving station;

generating said equalization function over a symbol span greater than the memory span of said dispersive medium;

receiving said prescribed sequence of known symbols at said receiving station and subjecting said received sequence to said equalization function, while adjusting the weighting coefficients of said equalization function in response to said received sequence, and at the termination of the transmission of said prescribed sequence of known symbols, establishing the symbol span of said equalization functions over a memory span approximating that of said dispersive medium, over which the weighting coefficients have undergone a prescribed adjustment.

51. A communication scheme according to claim 50, wherein the symbol span of said equalization function is associated with those N+1 consecutive symbol locations within said original symbol span the weighting coefficients of which produces the largest sum of the squares value.

52. A communication scheme according to claim 50, wherein the symbol span of said equalization function is associated with those N+1 consecutive symbol locations within said original symbol span such that the largest weighting coefficient magnitude not included is minimized.

53. A communication scheme according to claim 50, wherein the symbol span of said equalization function is associated with those N+1 consecutive symbol locations within said original symbol span symmetrically surrounding the centroid of the values of the weighting coefficients.

54. A communication scheme according to claim 50, wherein said prescribed sequence of known symbols comprises a pseudo random symbol sequence.

55. A communication scheme according to claim 47, wherein said processing step further comprises the step of modifying the weighting coefficients of said equalization function for each frame of received symbols based upon M informaton symbols and estimated weighting coefficients of a previous frame.

56. A communication scheme according to claim 59, wherein said modifying step comprises the step of updating the weighting coefficients of said equalization function by a fraction of the correlation of the errors between received symbol values and calculated symbol values based upon said M information symbols, the 2N known symbols for the frame of interest and the previous frame, and the weighting coefficients of the previous frame.

57. A communication scheme according to claim 45, further including the step of sampling each received symbol at said receiving station a plurality of times, and said processing step includes the step of processing each of said symbol value samples to derive, as said estimates, those chosen information symbols whose samples result in minimizing the sum of the squares of the magnitudes of successive pluralities of noise signals corresponding to sampled values of received information and known symbols.

58. A communication scheme for communicating information symbols from a transmitting station to a receiving station, said information symbols being originally unknown at said receiving station, over a dispersive medium, comprising the steps of:

transmitting, from said transmitting station, said information symbols interleaved with additional symbols, said additional symbols being known at the receiving station;

receiving, at said receiving station, the interleaved known and unknown symbols transmitted from said transmitting station over said dispersive medium;

generating, at said receiving station, a replica of said known symbols; and processing the symbol values received at said receiving station by simulating the effect of said dispersive medium by generating an equalization function defining the dispersive characteristics of said medium and calculating estimates of said information symbols in accordance with a prescribed relationship between said simulated effect and said known and unknown received symbol values, that is algebraically equivalent to the expression:

$$\hat{B} = (W_2^{*T} W_2)^{-1} (W_2^{*T} (R - W_1 A)).$$

wherein: R may be represented as a column vector having a preselected number of received signal values as elements, definable by the equation $R = WT + N$, T being a column vector with a prescribed number of transmitted signal values as elements, N being a column vector having a predetermined number of noise values as elements, and W being a prescribed weighting coefficient matrix containing a preestablished number of weighting coefficients, so that $W_1$, $W_2$ A and B may be expressed by the equation $WT = W_1 A + W_2 B$, wherein vectors A and B respectively correspond to those portions of said T column vector containing the transmitted known signals and transmitted information signals, and $\hat{B}$ denotes the calculated values of B.

59. A communication scheme according to claim 58, wherein said processing step further comprises the step of producing as said estimates of said information symbols those information symbols capable of being transmitted for which the ratio of $(|b_{id} - \hat{b}_i|/\sigma_i)$ is smallest, where $\hat{b}_i$ is a respective one of the calculated values of $\hat{B}$, $b_{id}$ is a chosen information symbol value corresponding to the calculated value $\hat{b}_i$, and $\sigma_i$ is the standard deviation of the error $e_i = b_i - \hat{b}_i$, $\sigma^2$ being the variance of the additive noise terms $n_1$ through $n_{N+M}$, with the equation defining $\hat{B}$ being reiterated successively with new values of $b_i$ being considered as known values, until transmitted information symbols for each of said M information symbols per frame have been chosen.

60. A communication scheme according to claim 58, wherein said processing step further comprises the step of modifying the weighting coefficients of said equalization function for each frame of received symbols based upon said M information symbols and estimated weighting coefficients of a previous frame.

61. A communication scheme according to claim 60, wherein said modifying step comprises the step of updating the weighting coefficients of said equalization function by a fraction of the correlation of the errors between received symbol values and calculated symbol values based upon said M information symbols, the 2N known symbols for the frame of interest and the previous frame, and the weighting coefficients of the previous frame.

62. A communication scheme according to claim 58, wherein said synchronizing step comprises the steps of:

transmitting for a predetermined period of time from said transmitting station, a prescribed sequence of known symbols, said prescribed sequence being known at said receiving station;

generating said equalization function over a symbol span greater than the memory span of said dispersive medium;

receiving said prescribed sequence of known symbols at said receiving station and subjecting said received sequence to said equalization function, while adjusting the weighting coefficients of said equalization function in response to said received sequence, and at the termination of the transmission of said prescribed sequence of known symbols, establishing the symbol span of said equalization functions over a memory span, approximating that of said dispersive medium, for which the weighting coefficients have undergone a prescribed adjustment.

63. A communication scheme according to claim 62, wherein said synchronizing step further includes the steps of transmitting at said transmitting station, at least one prescribed frequency for a first preselected period of time followed by phase reversal of said at least one tone for a second preselected period of time, the transmission of said prescribed sequence of known signals following the termination of phase reversal of said at least one tone at the end of said second preselected period of time, and detecting, at said receiving station, said at least one tone including the phase reversal associated therewith, and commencing the adjustment of the weighting coefficients of said equalization function at the termination of a period of time corresponding to said second preselected period of time subsequent to detection of phase reversal of said at least one tone.

64. A communication scheme according to claim 63, wherein, during said synchronizing step, the weighting coefficients of said equalization function are adjusted so as to minimize the sum of the squares of the magnitudes of plural noise signal values associated with plural symbols of said prescribed sequence, the number of which corresponds to the number of symbols in successive frames of transmitted symbols.

65. A communication scheme according to claim 64, wherein, during said synchronizing step, said equalization function is defined so that each received symbol value $r_i$, corresponding to a known symbol within said prescribed sequence of known symbols, may be defined by the relationship:

$$r_i = \sum_{j=1}^{2N+2} W_j t_{i+j-1} + n_i,$$

where $W_j$ is the jth weighting coefficient of said equalization function, $t_j$ is the value of the jth transmitted symbol, $n_i$ is the noise created by said dispersive medium, and the symbol span of said equalization function is $2N+2$ symbols in length.

66. A communication scheme according to claim 58, further including the step of sampling each received symbol at said receiving station a plurality of times thereby obtaining plural channels of received symbol values, and said processing step is carried out for each of said channels and further includes the step of producing an estimate of an information symbol by choosing that information symbol capable of being transmitted which is closest to an end of the $b_1 - b_m$ values of $\hat{B}$ for that channel for which $(|b_{id} - b_i|/\sigma_i)$ is smallest, where $\hat{b}_i$ is a respective one of the calculated values of $\hat{B}$, $b_{id}$ is a chosen information signal value corresponding to the calculated value $\hat{b}_i$, and $\sigma$ is the standard deviation of the error $e_i = b_i - \hat{b}_i$, to correspond to said end value, and successively reiterating the equation defining B with newly decided end values of B considered as known values, for that channel only, until transmitted information symbols for each of said M information symbols per frame have been chosen.

67. A communication scheme according to claim 58, wherein said processing step further includes the step of producing an estimate of an information symbol by choosing that information symbol capable of being transmitted which is closest to an end of the $b_1 - b_m$ values of $\hat{B}$ for which $(|b_{id} - [b_i]\hat{b}_i|/\sigma_i)$ is smallest, where $\hat{b}_i$ is a respective one of the calculated values of $\hat{B}$, $b_{id}$ is a chosen information signal value corresponding to the calculated value $\hat{b}_i$, and $\sigma$ is the standard deviation of the error $e_i = b_i - \hat{b}_i$, to correspond to said end value and successively reiterating the equation defining $\hat{B}$ with newly decided end values of $\hat{B}$ considered as known values, until transmitted information symbols for each of said M information symbols per frame have been chosen.

68. A communication scheme according to claim 58, wherein said information and known symbols are interleaved in successive pluralities of information and known symbols to form successive frames of transmitted symbols, each frame containing a first plurality of N known symbols and a second plurality of M information symbols, one of said first and second pluralities of symbols immediately succeeding the other and successive frames of symbols immediately succeeding each other.

69. A communication scheme according to claim 58, wherein said information and said known symbols are assembled in respective pluralities of M and N symbols each, thereby forming a frame of symbols, successive frames being transmitted, and wherein said equalization function is defined so that each received symbol value $r_i$ may be defined by the relationship:

$$r_i = \sum_{j=1}^{N+1} W_j t_{i+j-1} + n_i,$$

where $W_j$ is the jth weighting coefficient of said equalization function, $t_j$ is the value of the jth transmitted symbol, $n_i$ is the noise created by said dispersive medium, and the symbol span of said equalization function is $N+1$ symbols in length.

70. A communication scheme according to claim 69, wherein said known symbols are derived from a pseudo-noise symbol sequence.

71. A communication scheme according to claim 69, further including the step of synchronizing, at said receiving station, the generation of said replica of said known symbols with the known symbols contained in the transmitted symbols as received at said receiving station.

72. A communication scheme according to claim 71, wherein said synchronizing step comprises the steps of:
transmitting, for a predetermined period of time from said transmitting station, a prescribed sequence of known symbols, said prescribed sequence being known at said receiving station;
generating said equalization function over a symbol span greater than the memory span of said dispersive medium;
receiving said prescribed sequence of known symbols at said receiving station and subjecting said received sequence to said equalization function, while adjusting the weighting coefficients of said equalization function in response to said received sequence, and
at the termination of the transmission of said prescribed sequence of known symbols, establishing the symbol span of said equalization functions over a memory span, approximating that of said dispersive medium, over which the weighting coefficients have undergone a prescribed adjustment.

73. A communication system according to claim 72, wherein said prescribed sequence of known symbols comprises a pseudo random symbol sequence.

74. A communication system according to claim 71, wherein said synchronizing step comprises the steps of:
transmitting for a predetermined period of time from said transmitting station, a prescribed sequence of known symbols, said prescribed sequence being known at said receiving station;
generating said equalization function over a symbol span greater than the memory span of said dispersive medium;
receiving said prescribed sequence of known symbols at said receiving station and subjecting said received sequence to said equalization function, while adjusting the weighting coefficients of said equalization function in response to said received sequence, and
at the termination of the transmission of said prescribed sequence of known symbols, establishing the symbol span of said equalization functions over a memory span, approximating that of said dispersive medium, over which the weighting coefficients have undergone a prescribed adjustment.

75. A communication system according to claim 74, wherein said synchronizing step further includes the steps of
transmitting at said transmitting station, at least one prescribed tone for a first preselected period of time followed by phase reversal of said at least one tone for a second preselected period of time, the transmission of said prescribed sequence of known signals following the termination of phase reversal of said at least one tone at the end of said second preselected period of time, and
detecting, at said receiving station, said at least one tone including the phase reversal associated therewith, and commencing the adjustment of the weighting coefficients of said equalization function at the termination of a period of time corresponding to said second preselected period of time subsequent to detection of phase reversal of said at least one tone.

76. A communication system according to claim 75, wherein during said synchronizing step, said equalization function is defined so that each received symbol value $r_i$, corresponding to a known symbol within said prescribed sequence of known symbols, may be defined by the relationship:

$$r_i = \sum_{j=1}^{2N+2} W_j t_{i+j-1} + n_i,$$

where $W_j$ is the jth weighting coefficient of said equalization function, $t_j$ is the value of the jth transmitted symbol, $n_i$ is the noise created by said dispersive medium, and the symbol span of said equalization function is $2N+2$ symbols in length.

77. A communication system according to claim 69, wherein said processing step further comprises the step of modifying the weighting coefficients of said equalization function for each frame of received symbols based upon M information symbols and estimated weighting coefficients of a previous frame.

78. A communication system according to claim 77, wherein said modifying step comprises the step of updating the weighting coefficients of said equalization function by a fraction of the correlation of the errors between received symbol values and calculated symbol values based upon M transmitted information symbols, the 2N known symbols for the frame of interest and the previous frame, and the weighting coefficients of the previous frame.

79. A communication system according to claim 58, wherein said processing step further comprises the step of modifying the weighting coefficients of said equalization function for each frame of received symbols based upon M information symbols and estimated weighting coefficients of a previous frame.

80. A communication system according to claim 79, wherein said modifying step comprises the step of updating the weighting coefficients of said equalization function by a fraction of the correlation of the errors between received symbol values and calculated symbol values based upon M transmitted information symbols, the 2N known symbols for the frame of interest and the previous frame, and the weighting coefficients of the previous frame.

81. A communication system according to claim 58, further including the step of sampling each received symbol at said receiving station a plurality of times for each symbol interval, and said processing step includes calculating said estimates on the basis of the sampled symbol values.

82. A communication system according to claim 58, further including the step of sampling each received symbol at said receiving station a plurality of times, thereby obtaining plural channels of received symbol values, and said processing step is carried out for each of said channels and includes the step of producing an estimate of an information signal by choosing that information signal capable of being transmitted which is closest to an end of the $b_1-b_m$ values of $\hat{B}$ for that channel for which a prescribed calculated error is smallest, to correspond to said end value, and successively reiterating the expression defining $\hat{B}$, with newly decided end values of $\hat{B}$ considered as known values, for that channel only, until transmitted information signals for each of said M information signals per frame have been chosen.

83. For use in a communication system wherein information signals interleaved with known signals are transmitted from a transmitting station over a dispersive medium, a receiver apparatus for receiving the transmitted signals subject to the influence of said dispersive medium and providing estimates of the originally transmitted information signals, comprising:

means for generating a replica of said known signals,
time domain processing means for simulating the time domain effect of said dispersive medium on signals transmitted through it by deducing prescribed characteristics of said medium, and for producing estimates of said information signals in accordance with a preselected relationship between said prescribed characteristics of said simulated effect and said known and received signals, and
output conversion means, coupled to said processing means, for converting said estimates of said information signals into output signals representative of the originally transmitted information signals.

84. A receiver apparatus according to claim 83, wherein said processing means includes means for simulating the effect of said dispersive medium by an equalization function through which dispersive characteristics of said medium are defined and for producing, as estimates of said information signals, those information signals capable of being transmitted which are closest to information signals, the values for which minimize the sum of the squares of the magnitudes of successive sets of noise signals corresponding to received information and known signals, calculated in accordance with said prescribed relationship.

85. A receiver apparatus according to claim 84, wherein said information signals and said known signals are interleaved in sets of signals to form successive frames of transmitted signals, each frame comprising N known signals followed by M unknown signals, said equalization function being defined so that each received signal value $r_i$ may be defined by $$r_i = \sum_{j=1}^{N+1} W_j t_{i+j-1} + n_i,$$

where $W_j$ is the jth weighting coefficient of said equalization function, $t_j$ is the value of the jth transmitted signal, $n_i$ is the noise created by said dispersive medium, and the symbol span of said equalization function is $N+1$ symbols.

86. A receiver apparatus according to claim 85, which further includes means for sampling each received signal a plurality of times, and said processing means includes means for processing each of said signal samples to derive, as said estimates, those chosen information signals whose samples result in minimizing the sum of the squares of the magnitudes of successive pluralities of noise signals corresponding to sampled values of received information and known signals.

87. A receiver apparatus according to claim 85, wherein said processing means includes means for modifying the weighting coefficients of said equalization function for each frame of received signals based upon M information signals and estimated weighting coefficients of a previous frame.

88. A receiver apparatus according to claim 87, wherein said weighting coefficients modifying means includes means for updating the weighting coefficients of said equalization function by a fraction of the correlation of the errors between the received signal values and calculated signal values based upon said M information signals, the 2N known values for the frame of interest and the previous frame, and the weighting coefficients of the previous frame.

89. A receiver apparatus according to claim 87, wherein said processing means includes means for modifying the weighting coefficients of said equalization function for each frame of received signals based upon M information signals and estimated weighting coefficients of a previous frame.

90. A receiver apparatus according to claim 89, wherein said weighting coefficients modifying means includes means for updating the weighting coefficients of said equalization function by a fraction of the correlation of the errors between the received signal values and calculated signal values based upon said M received information signals, the 2N known values for the frame of interest and the previous frame, and the weighting coefficients of the previous frame.

91. A receiver apparatus according to claim 83, wherein said information signals and said known signals are interleaved in successive pluralities of information and known signals to form successive frames of transmitted signals as received by said receiving apparatus, each frame containing a first plurality of N known signals and a second plurality of M information signals, one of said first and second pluralities of signals immediately succeeding the other of said first and second pluralities of signals so that there is no gap therebetween.

92. A receiver apparatus according to claim 91, wherein said known signals comprise a pseudo-noise signal sequence.

93. A receiver apparatus according to claim 92, wherein said processing means includes means for synchronizing the replica of said known signals generated by said generating means with the known signals contained in the received signals.

94. A receiver apparatus according to claim 93, wherein said processing means includes means for simulating the effect of said dispersive medium by generating an equalization function through which dispersive characteristics of said medium are simulated, the symbol span of said equalization function being originally greater than the memory span of the dispersive medium, and wherein said synchronizing means includes means for causing said equalization function to be established over a symbol span, approximating the memory span of said dispersive medium, over which weighting coefficients of said equalization function undergo a prescribed adjustment in response to the reception of a sequence of known signals over a prescribed period of time.

95. A communication system according to claim 94, wherein said processing means includes means for detecting at least one tone, including a phase reversal thereof subsequent thereto, and for commencing the adjustment of the weighting coefficients of said equalization function in response to the termination of phase reversal of said at least one tone.

96. A receiver apparatus according to claim 95, wherein within said processing means, during synchronization, the weighting coefficients of said equalization function are adjusted so as minimize the sum of the squares of the magnitudes of plural noise signal values associated with plural signals in said replica of known signals, the number of which corresponds to the number of signals in successive frames of received signals.

97. A receiver apparatus according to claim 96, wherein within said processing means, during synchronization, said equalization functions is defined so that each received signal value $r_i$, corresponding to a known signal within said replica of known signals, may be defined by the relationship:

$$r_i = \sum_{j=1}^{2N+2} W_j t_{i+j-1} + n_i$$

where $W_j$ is the jth weighting coefficient of said equalization function, $t_j$ is the value of the jth transmitted signal, $n_i$ is the noise created by said dispersive medium, and the symbol span of said equalization function is $2N+2$ symbols in length.

98. A receiver apparatus according to claim 94, wherein said information signals and said known signals are interleaved in successive pluralities of information and known signals to form successive frames of received signals, each frame containing a first plurality of N known signals and a second plurality of M information signals, one of said first and second pluralities of signals immediately succeeding the other of said first and second pluralities of signals so that there is no gap therebetween.

99. A receiver apparatus according to claim 98, wherein the symbol span of said equalization function is associated with those $N+1$ consecutive symbol locations within said original symbol span the weighting coefficients of which produces the largest sum of the squares value.

100. A receiver apparatus according to claim 98, wherein the symbol span of said equalization function is associated with those $N+1$ consecutive symbol locations within said original symbol span such that the largest weighting coefficient magnitude not included is minimized.

101. A receiver apparatus according to claim 98, wherein the symbol span of said equalization function is associated with those $N+1$ consecutive symbol locations within said original symbol span symmetrically surrounding the centroid of the values of the weighting coefficients.

102. A receiver apparatus according to claim 83, wherein said time domain processing means includes means for calculating said estimate of the transmitted values of said information signals in accordance with a relationship that is algebraically equivalent to the expression:

$$\hat{B} = (W_2^{*T} W_2)^{-1}(W_2^{*T}(R - W_1 A)),$$

wherein: R may be represented as a column vector having a preselected number of received signal values as elements, definable by the equation $R = WT + N$, T being a column vector with a prescribed number of transmitted signal values as elements, N being a column vector having a predetermined number of noise values as elements, and W being a prescribed weighting coefficient matrix containing a preestablished number of weighting coefficients, so that $W_1$, $W_2$, A and B may be expressed by the equation $WT = W_1 A + W_2 B$, wherein vectors A and B respectively correspond to those portions of said T column vector containing the transmitted known signals and transmitted information signals, and $\hat{B}$ denotes the calculated values of B.

103. A receiver apparatus according to claim 83, wherein said time domain processing means includes means for simulating the effect of said dispersive medium by an equalization function through which dispersive characteristics of said medium are defined.

104. A receiver apparatus according to claim 103, wherein said information and said known signals are interleaved in sets of signals to form successive frames of transmitted signals, each frame comprising N known signals followed by M unknown signals, said equalization function being defined so that each received signal value $r_i$ may be defined by $$r_i = \sum_{j=1}^{N+1} W_j t_{i+j-1} + n_i,$$

where $W_j$ is the jth weighting coefficient of said equalization function, $t_j$ is the value of the jth transmitted signal, $n_i$ is the noise created by said dispersive medium, and the symbol span of said equalization function is N+1 symbols.

105. A receiver apparatus according to claim 103, wherein said processing means includes means for synchronizing the replica of said known signals generated by said generating means with the known signals contained in the transmitted signals as received by said receiving apparatus.

106. A receiver apparatus according to claim 105, wherein said processing means includes means for simulating the effect of said dispersive medium by generating an equalization function through which dispersive characteristics of said medium are defined, the symbol span of said equalization function being originally greater than the memory span of the dispersive medium, and wherein said synchronizing means includes means for causing said equalization function to be established over a symbol span, approximating the memory span of said dispersive medium, over which weighting coefficients of said equalization function undergo a prescribed adjustment in response to the receipt of a sequence of known signal transmitted from said transmitting apparatus over a prescribed period of time.

107. A receiver apparatus according to claim 106, wherein
said transmitting apparatus further includes means for transmitting at least one prescribed tone for a first preselected period of time followed by phase reversal of said at least one tone for a second preselected period of time, the transmission of said prescribed sequence of known signals following the termination of phase reversal of said at least one tone at the end of said second preselected period of time, and
at said receiving station said processing means includes means for detecting said at least one tone, including the phase reversal associated therewith, and commencing the adjustment of the weighting coefficients of said equalization function at the termination of a period of time corresponding to said second preselected period of time subsequent to detection of phase reversal of said at least one tone.

108. A receiver apparatus according to claim 107, wherein said time domain processing means includes means for calculating said estimate of the transmitted values of said information signals in accordance with a relationship that is algebraically equivalent to the expression:

$$B = (W_2^* T W_2)^{-1} (W_2^* T(R - W_1 A)),$$

wherein: R may be represented as a column vector having a preselected number of received signal values as elements, definable by the equation R=WT+N, T being a column vector with a prescribed number of transmitted signal values as elements, N being a column vector having a predetermined number of noise values as elements, and W being a prescribed weighting coefficient matrix containing a preestablished number of weighting coefficients, so that $W_1$, $W_2$, A and B may be expressed by the equation $WT = W_1 A + W_2 B$, wherein vectors A and B respectively correspond to those portions of said T column vector containing the transmitted known signals and transmitted information signals, and B denotes the calculated values of B, and within said time domain processing means, during synchronization, the weighting coefficients of said equalization function are established in accordance with said expression.

109. A receiver apparatus according to claim 108, wherein within said processing means, during synchronization, said equalization function is defined so that each received signal value $r_i$, corresponding to a known signal within said replica of known signals, may be defined by the relationship:

$$r_i = \sum_{j=1}^{2N+2} W_j t_{i+j-1} + n_i,$$

where $W_j$ is the jth weighting coefficient of said equalization function, $t_j$ is the value of the jth transmitted signal, $n_i$ is the noise created by said dispersive medium, and the symbol span of said equalization function is 2N+2 symbols in length.

110. A receiver apparatus according to claim 106, wherein said information signals and said known signals are interleaved in successive pluralities of information and known signals to form successive frames of transmitted signals, each frame containing a first plurality of N known signals and a second plurality of M information signals, one of said first and second pluralities of signals immediately succeeding the other of said first and second pluralities of signals so that there is no gap therebetween.

111. A receiver apparatus according to claim 103, wherein said processing means includes means for modifying the weighting coefficients of said equalization function for each frame of received signals based upon M information signals and estimated weighting coefficients of a previous frame.

112. A receiver apparatus according to claim 111, wherein said weighting coefficients modifying means includes means for updating the weighting coefficients of said equalization function by a fraction of the correlation of the errors between the received signal values and calculated signal values based upon M transmitted information signals, the 2N known values for the frame of interest and the previous frame, and the weighting coefficients of the previous frame.

113. A receiver apparatus according to claim 111, wherein said weighting coefficients modifying means includes means for updating the weighting coefficients of said equalization function by a fraction of the correlation of the errors between the received signal values and calculated signal values based upon M transmitted information signals, the 2N known values for the frame of interest and the previous frame, and the weighting coefficients of the previous frame.

114. A receiver apparatus according to claim 111, wherein said processing means includes means for synchronizing the replica of said known signals generated by said generating means with the known signals contained in the transmitted signals as received by said receiving apparatus.

115. A receiver apparatus according to claim 83, wherein said receiving apparatus further includes means for sampling each received signals a plurality of times, and said processing means includes means for calculating said estimates on the basis of the sampled signal values.

116. A receiver apparatus according to claim 83, wherein said information signals and said known signals are interleaved in successive pluralities of information and known signals to form successive frames of transmitted signals, each frame containing a first plurality of N known signals and a second plurality of M information signals, one of said first and second pluralities of signals immediately succeeding the other of said first and second pluralities of signals so that there is no gap therebetween.

117. A receiver apparatus according to claim 116, wherein said known signals comprise a pseudo noise signal sequence.

118. A receiver apparatus according to claim 83, wherein said receiving apparatus further includes means for sampling each received signal a plurality of times thereby obtaining plural channels of received signal values, and signal processing by said signal processing means is carried out for each of said channels and said processing means further includes means for producing an estimate of an information signal by choosing that information signal capable of being transmitted which is closest to an end of the $b_1-b_m$ values of $\hat{B}$ for that channel for which a prescribed calculated error is smallest, to correspond to said end value, and successively reiterating the expression defining $\hat{B}$, with newly decided end values of $\hat{B}$ considered as known values, for that channel only, until transmitted information signals for each of said M information signals per frame have been chosen.

119. A receiver apparatus according to claim 83, wherein said processing means includes means for simulating the effect of said dispersive medium by generating an equalization function through which dispersive characteristics of said medium are defined, the symbol span of said equalization function being originally greater than the memory span of the dispersive medium, and wherein said synchronizing means includes means for causing said equalization function to be established over a symbol span, approximating the memory span of said dispersive medium, over which weighting coefficients of said equalization function undergo a prescribed adjustment in response to the receipt of a sequence of known signals transmitted from said transmitting apparatus over a prescribed period of time.

120. A receiver apparatus according to claim 119, wherein said information signals and said known signals are interleaved in successive pluralities of information and known signals to form successive frames of transmitted signals, each frame containing a first plurality of N known signals and a second plurality of M information signals, one of said first and second pluralities of signals immediately succeeding the other of said first and second pluralities of signals so that there is no gap therebetween.

121. For use in a communication scheme wherein information symbols originally unknown at a receiving station and interleaved with additional signals known at the receiving station are transmitted from a transmitting station over a dispersive medium, a method of deriving, at said receiving station, said information signals, comprising the steps of:
receiving the interleaved known and unknown symbols transmitted over said dispersive medium;
generating, at said receiving station, a replica of said known symbols; and
processing the symbol values received at said receiving station by simulating the effect of said dispersive medium by generating an equalization function defining the dispersive characteristics of said medium and producing, as estimates of said information symbols, those information symbols capable of being transmitted which are closest to information symbols the values of which minimize the sum of the squares of the magnitudes of successive pluralities of noise signals corresponding to received information and known symbols, calculated in accordance with the prescribed relationship between said simulated effect and said known and received symbol values.

122. A method according to claim 121, wherein said information and known symbols are interleaved in successive pluralities of information and known symbols to form successive frames of symbols, each frame containing a first plurality of N known symbols and a second plurality of M information symbols, one of said first and second pluralities of symbols immediately succeeding the other and successive frames of symbols immediately succeeding each other.

123. A method according to claim 121, wherein said information and said known symbols are assembled in respective pluralities of M and N symbols each, thereby forming a frame of symbols, successive frames being received, and wherein said equalization function is defined so that each received symbol value $r_i$ may be defined by the relationship:

$$r_i = \sum_{j=1}^{N+1} W_j t_{i+j-1} + n_i,$$

where $W_j$ is the jth weighting coefficient of said equalization function, $t_j$ is the value of the jth transmitted symbol, $n_i$ is the noise created by said dispersive medium, and the symbol span of said equalization function is N+1 symbols in length.

124. A method according to claim 123, wherein said known symbols are derived from a pseudo-noise symbol sequence.

125. A method according to claim 123, further including the step of synchronizing, at said receiving station, the generation of said replica of said known symbols with the known symbols contained in the received symbols.

126. A method according to claim 123, wherein said processing step further comprises the step of modifying the weighting coefficients of said equalization function for each frame of received symbols based upon M information symbols and estimated weighting coefficients of a previous frame.

127. A method according to claim 126, wherein said modifying step comprises the step of updating the weighting coefficients of said equalization function by a fraction of the correlation of the errors between received symbol values and calculated symbol values based upon said M information symbols, the 2N known symbols for the frame of interest and the previous frame, and the weighting coefficients of the previous frame.

128. A method according to claim 121, further including the step of sampling each received symbol at said receiving station a plurality of times, and said processing step includes the step of processing each of said symbol value samples to derive, as said estimates, those chosen information symbols whose samples result in minimizing the sum of the squares of the magnitudes of successive pluralities of noise signals corresponding to sampled values of received information and known symbols.

129. For use in a communication scheme wherein information symbols originally unknown at a receiving station and interleaved with additional signals known at the receiving station are transmitted from a transmitting station over a dispersive medium, a method of deriving, at said receiving station, said information signals, comprising the steps of of:

receiving the interleaved known and unknown symbols transmitted over said dispersive medium;

generating, at said receiving station, a replica of said known symbols; and processing the symbol values received at said receiving station by simulating the effect of said dispersive medium by generating an equalization function defining the dispersive characteristics of said medium and calculating estimates of said information symbols in accordance with a prescribed relationship, between said simulated effect and said known and unknown received symbol values, that is algebraically equivalent to the expression:

$$\hat{B} = (W_2 {}^*{}^T W_2)^{-1}(W_2 {}^*{}^T (R - W_1 A)),$$

wherein: R may be represented as a column vector having a preselected number of received signal values as elements, definable by the equation $R = WT + N$, T being a column vector with a prescribed number of transmitted signal values as elements, N being a column vector having a predetermined number of noise values as elements, and W being a prescribed weighting coefficient matrix containing a preestablished number of weighting coefficients, so that $W_1$, $W_2$ A and B may be expressed by the equation $WT = W_1 A + W_2 B$, wherein vectors A and B respectively correspond to those portions of said T column vector containing the transmitted known signals and transmitted information signals, and $\hat{B}$ denotes the calculated values of B.

130. A method according to claim 129, wherein said information and known symbols are interleaved in successive pluralities of information and known symbols to form successive frames of transmitted symbols, each frame containing a first plurality of N known symbols and a second plurality of M information symbols, one of said first and second pluralities of symbols immediately succeeding the other and successive frames of symbols immediately succeeding each other.

131. A method according to claim 129, wherein said information and said known symbols are assembled in respective pluralities of M and N symbols each, thereby forming a frame of symbols, successive frames being transmitted, and wherein said equalization function is defined so that each received symbol value $r_i$ may be defined by the relationship:

$$r_i = \sum_{j=1}^{N+1} W_j t_{i+j-1} + n_i,$$

where $W_j$ is the jth weighting coefficient of said equalization function, $t_j$ is the value of the jth transmitted symbol, $n_i$ is the noise created by said dispersive medium, and the symbol span of said equalization function is $N+1$ symbols in length.

132. A method according to claim 131, wherein said known symbols are derived from a pseudo-noise symbol sequence.

133. A method according to claim 131, further including the step of synchronizing, at said receiving station, the generation of said replica of said known symbols with the known symbols contained in the transmitted symbols as received at said receiving station.

134. A method according to claim 133, wherein said synchronizing step comprises the steps of:

transmitting for a predetermined period of time from said transmitting station, a prescribed sequence of known symbols, said prescribed sequence being known at said receiving station;

generating said equalization function over a symbol span greater than the memory span of said dispersive medium;

receiving said prescribed sequence of known symbols at said receiving station and subjecting said received sequence to said equalization function, while adjusting the weighting coefficients of said equalization function in response to said received sequence, and at the termination of the transmission of said prescribed sequence of known symbols, establishing the symbol span of said equalization functions over a memory span, approximating that of said dispersive medium, over which the weighting coefficients have undergone a prescribed adjustment.

135. A method according to claim 134, wherein said prescribed sequence of known symbols comprises a pseudo random symbol sequence.

136. A method according to claim 133, wherein said synchronizing step comprises the steps of:

transmitting for a predetermined period of time from said transmitting station, a prescribed sequence of known symbols, said prescribed sequence being known at said receiving station;

generating said equalization function over a symbol span greater than the memory span of said dispersive medium;

receiving said prescribed sequence of known symbols at said receiving station and subjecting said received sequence to said equalization function, while adjusting the weighting coefficients of said equalization function in response to said received sequence, and at the termination of the transmission of said prescribed sequence of known symbols, establishing the symbol span of said equalization functions over a memory span, approximating that of said dispersive medium, for which the weighting coefficients have undergone a prescribed adjustment.

137. A method according to claim 136, wherein said synchronizing step further includes the steps of transmitting at said transmitting station, at least one prescribed frequency for a first preselected period of time followed by phase reversal of said at least one tone for a second preselected period of time, the transmission of said prescribed sequence of known signals following the termination of phase reversal of said at least one tone at the end of said second preselected period of time, and detecting, at said receiving station, said at least one tone including the phase reversal associated therewith, and commencing the adjustment of the weighting coefficients of said equalization function at the termination of a period of time corresponding to said second preselected period of time subsequent to detection of phase reversal of said at least one tone.

138. A method according to claim 137, wherein during said synchronizing step, said equalization function is defined so that each received symbol value $r_i$, corresponding to a known symbol within said prescribed sequence of known symbols, may be defined by the relationship:

$$r_i = \sum_{j=1}^{2N+2} W_j t_{i+j-1} + n_i$$

where $W_j$ is the jth weighting coefficient of said equalization function, $t_j$ is the value of the jth transmitted symbol, $n_i$ is the noise created by said dispersive medium, and the symbol span of said equalization function is $2N+2$ symbols in length.

139. A method according to claim 131, wherein said processing step further comprises the step of modifying the weighting coefficients of said equalization function for each frame of received symbols based upon M information symbols and estimated weighting coefficients of a previous frame.

140. A method according to claim 139, wherein said modifying step comprises the step of updating the weighting coefficients of said equalization function by a fraction of the correlation of the errors between received symbol values and calculated symbol values based upon M transmitted information symbols, the 2N known symbols for the frame of interest and the previous frame, and the weighting coefficients of the previous frame.

141. A method according to claim 129, wherein said processing step further comprises the step of modifying the weighting coefficients of said equalization function for each frame of received symbols based upon M information symbols and estimated weighting coefficients of a previous frame.

142. A method according to claim 141, wherein said modifying step comprises the step of updating the weighting coefficients of said equalization function by a fraction of the correlation of the errors between received symbol values and calculated symbol values based upon M transmitted information symbols, the 2N known symbols for the frame of interest and the previous frame, and the weighting coefficients of the previous frame.

143. A method according to claim 129, further including the step of sampling each received symbol at said receiving station a plurality of times, and said processing step includes calculating said estimates on the basis of the sampled symbol values.

144. A method according to claim 129, further including the step of sampling each received symbol at said receiving station a plurality of times, thereby obtaining plural channels of received symbol values, and said processing step is carried out for each of said channels and includes the step of producing an estimate of an information signal by choosing that information signal, capable of being transmitted which is closest to an end of the $b_1-b_m$ values of $\hat{B}$ for that channel for which a prescribed calculated error is smallest, to correspond to said end value, and successively reiterating the expression defining B, with newly decided end values of B considered as known values, for that channel only, until transmitted information signals for each of said M information signals per frame have been chosen.

145. A method according to claim 129, further including the step of sampling each received symbol at said receiving station a plurality of times thereby obtaining plural channels of received symbol values, and said processing step is carried out for each of said channels and further includes the step of producing an estimate of an information symbol by choosing that information symbol capable of being transmitted which is closest to an end of the $b_1-b_m$ values of B for that channel for which $(|b_{id}-b_i|/\sigma_i)$ is smallest, where $b_i$ is a respective one of the calculated values of B, $b_{id}$ is a chosen information signal value corresponding to the calculated value $b_i$, and $\sigma$ is the standard deviation of the error $e_i=b_i-b_i$, to correspond to said end value, and successively reiterating the equation defining B with newly decided end values of B considered as known values, for that channel only, until received information symbols for each of said M information symbols per frame have been chosen.

146. A method according to claim 129, wherein said processing step further includes the step of producing an estimate of an information symbol by choosing that information symbol capable of being transmitted which is closest to an end of the $b_1-b_m$ values of B for which $(|b_{id}-b_i|/\sigma_i)$ is smallest, where $b_i$ is a respective one of the calculated values of B, $b_{id}$ is chosen information signal value corresponding to the calculated value $b_i$, and $\sigma$ is the standard deviation of the error $e_i=b_i-b_i$, to correspond to said end value and successively reiterating the equation defining B with newly decided end values of B considered as known values, until received information symbols for each of said M information symbols per frame have been chosen.

* * * * *